(12) United States Patent
Kim et al.

(10) Patent No.: US 7,973,357 B2
(45) Date of Patent: Jul. 5, 2011

(54) NON-VOLATILE MEMORY DEVICES

(75) Inventors: Hyun-Suk Kim, Gyeonggi-do (KR); Sun-Il Shim, Seoul (KR); Chang-Seok Kang, Gyeonggi-do (KR); Won-Cheol Jeong, Seoul (KR); Jung-Dal Choi, Seoul (KR); Jae-Kwan Park, Gyeonggi-do (KR); Seung-Hyun Lim, Gyeonggi-do (KR); Sun-Jung Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 66 days.

(21) Appl. No.: 12/338,308

(22) Filed: Dec. 18, 2008

(65) Prior Publication Data

US 2009/0159962 A1 Jun. 25, 2009

(30) Foreign Application Priority Data

Dec. 20, 2007 (KR) .................. 10-2007-0134356
Jun. 19, 2008 (KR) .................. 10-2008-0057959
Jun. 30, 2008 (KR) .................. 10-2008-0062711

(51) Int. Cl.
*H01L 29/66* (2006.01)

(52) U.S. Cl. ........... 257/326; 257/E21.68; 257/E29.129; 257/314; 257/315; 257/316; 438/266; 438/267; 438/268

(58) Field of Classification Search ............. 257/326
See application file for complete search history.

(56) References Cited

U.S. PATENT DOCUMENTS

| | | | | |
|---|---|---|---|---|
| 4,686,550 A * | 8/1987 | Capasso et al. ............. 257/12 |
| 5,172,384 A * | 12/1992 | Goronkin et al. .......... 372/45.01 |
| 5,668,438 A * | 9/1997 | Shi et al. .................. 313/504 |
| 5,774,400 A * | 6/1998 | Lancaster et al. .......... 365/185.3 |
| 6,586,797 B2 * | 7/2003 | Forbes et al. .................. 257/325 |
| 6,740,928 B2 * | 5/2004 | Yoshii et al. .................. 257/315 |
| 6,797,996 B1 * | 9/2004 | Hikita et al. .................. 257/197 |
| 6,900,588 B2 * | 5/2005 | Adachi et al. .................. 313/504 |
| 6,950,340 B2 * | 9/2005 | Bhattacharyya .......... 365/185.18 |
| 6,951,694 B2 * | 10/2005 | Thompson et al. .......... 428/690 |
| 6,963,103 B2 * | 11/2005 | Forbes .................. 257/315 |
| 7,187,587 B2 * | 3/2007 | Forbes .................. 365/185.23 |
| 7,221,586 B2 * | 5/2007 | Forbes et al. .............. 365/185.05 |
| 7,233,105 B2 * | 6/2007 | Itai et al. .................. 313/506 |
| 7,247,538 B2 | 7/2007 | Lee et al. |
| 7,279,740 B2 * | 10/2007 | Bhattacharyya et al. ..... 257/324 |
| 7,300,562 B2 * | 11/2007 | Hu et al. .................. 205/257 |
| 7,332,768 B2 * | 2/2008 | Govoreanu et al. .......... 257/321 |
| 7,338,856 B2 * | 3/2008 | Chen et al. .................. 438/257 |
| 7,400,009 B2 * | 7/2008 | Lee et al. .................. 257/316 |

(Continued)

FOREIGN PATENT DOCUMENTS

JP 05-267684 10/1993

(Continued)

*Primary Examiner* — N Drew Richards
*Assistant Examiner* — Ankush K Singal
(74) *Attorney, Agent, or Firm* — Myers Bigel Sibley & Sajovec

(57) ABSTRACT

Non-volatile memory devices are provided including a control gate electrode on a substrate; a charge storage insulation layer between the control gate electrode and the substrate; a tunnel insulation layer between the charge storage insulation layer and the substrate; a blocking insulation layer between the charge storage insulation layer and the control gate electrode; and a material layer between the tunnel insulation layer and the blocking insulation layer, the material layer having an energy level constituting a bottom of a potential well.

9 Claims, 16 Drawing Sheets

U.S. PATENT DOCUMENTS

| | | | |
|---|---|---|---|
| 7,473,959 B2* | 1/2009 | Lee et al. | 257/316 |
| 7,545,674 B2* | 6/2009 | Forbes et al. | 365/185.05 |
| 7,560,767 B2* | 7/2009 | Yasuda et al. | 257/316 |
| 7,583,534 B2* | 9/2009 | Forbes et al. | 365/185.18 |
| 7,768,062 B2* | 8/2010 | Bhattacharyya et al. | 257/324 |
| 7,786,526 B2* | 8/2010 | Takano et al. | 257/324 |
| 7,829,938 B2* | 11/2010 | Bhattacharyya | 257/325 |
| 7,898,850 B2* | 3/2011 | Min et al. | 365/185.03 |
| 2002/0071963 A1* | 6/2002 | Fujii | 428/690 |
| 2003/0043633 A1* | 3/2003 | Forbes et al. | 365/185.28 |
| 2003/0048666 A1* | 3/2003 | Eldridge et al. | 365/185.28 |
| 2003/0049900 A1* | 3/2003 | Forbes et al. | 438/201 |
| 2003/0122182 A1* | 7/2003 | Specht et al. | 257/315 |
| 2003/0213951 A1* | 11/2003 | Kornilovich et al. | 257/40 |
| 2004/0004245 A1* | 1/2004 | Forbes et al. | 257/315 |
| 2005/0006696 A1* | 1/2005 | Noguchi et al. | 257/316 |
| 2005/0023603 A1* | 2/2005 | Eldridge et al. | 257/315 |
| 2005/0040404 A1* | 2/2005 | Hu et al. | 257/77 |
| 2005/0247970 A1* | 11/2005 | Jeon et al. | 257/314 |
| 2006/0006454 A1* | 1/2006 | Wang | 257/314 |
| 2006/0008966 A1* | 1/2006 | Forbes et al. | 438/201 |
| 2006/0258090 A1* | 11/2006 | Bhattacharyya et al. | 438/257 |
| 2006/0261401 A1* | 11/2006 | Bhattacharyya | 257/316 |
| 2007/0029625 A1* | 2/2007 | Lue et al. | 257/411 |
| 2007/0045711 A1* | 3/2007 | Bhattacharyya | 257/315 |
| 2007/0128846 A1* | 6/2007 | Choi et al. | 438/622 |
| 2007/0228448 A1* | 10/2007 | Yamazaki et al. | 257/314 |
| 2007/0281426 A1* | 12/2007 | Wang | 438/261 |
| 2008/0009117 A1* | 1/2008 | Bhattacharyya et al. | 438/264 |
| 2008/0093661 A1* | 4/2008 | Joo et al. | 257/324 |
| 2008/0116506 A1* | 5/2008 | Lue | 257/324 |
| 2008/0116507 A1* | 5/2008 | Ino et al. | 257/324 |
| 2009/0096009 A1* | 4/2009 | Dong et al. | 257/321 |
| 2009/0101961 A1* | 4/2009 | He et al. | 257/319 |
| 2009/0140318 A1* | 6/2009 | Dong | 257/321 |

FOREIGN PATENT DOCUMENTS

| | | |
|---|---|---|
| JP | 2003-068897 | 3/2003 |
| JP | 2005-311379 | 11/2005 |
| JP | 2006-310662 | 11/2006 |
| KR | 1020030002298 A | 1/2003 |
| KR | 1020050101876 A | 10/2005 |
| KR | 1020050102864 A | 10/2005 |
| KR | 1020060091649 A | 8/2006 |
| KR | 1020060105379 A | 10/2006 |
| KR | 1020060113478 A | 11/2006 |

* cited by examiner

NON-VOLATILE MEMORY DEVICES

CLAIM OF PRIORITY

This application claims the benefit of Korean Patent Application No. 10-2007-0134356, filed Dec. 20, 2007, Korean Patent Application No. 10-2008-0057959, filed Jun. 19, 2008 and Korean Patent Application No. 10-2008-0062711, filed on Jun. 30, 2008 in the Korean Intellectual Property Office, the disclosures of which are hereby incorporated herein by reference as if set forth in their entirety.

FIELD OF THE INVENTION

The present invention relates generally to semiconductor devices and, more particularly, to non-volatile memory devices.

BACKGROUND

Semiconductor memory devices are divided into volatile memory devices and non-volatile memory devices. Volatile memory devices lose their stored data when there is no power supplied to the memory device. Representative volatile memory devices are Dynamic Random Access Memory (DRAM) devices and Static Random Access Memory (SRAM) devices. Non-volatile memory devices retain their stored data even when there is no power supplied to the memory device. Due to these characteristics, the non-volatile memory devices may be used as storage media loaded in portable and/or electronic products.

As semiconductor industries have been highly developed, various characteristic enhancements of the non-volatile memory devices have become desirable. Data stored in the non-volatile memory devices may be damaged due to various external and/or internal factors. Losing data in the non-volatile memory devices may cause errors in the functionality of the device. Currently, since the demand for highly developed semiconductor devices is constantly increasing, developers are actively researching methods to improve various characteristics of the non-volatile memory devices.

SUMMARY

Some embodiments of the present invention provide non-volatile memory devices including a control gate electrode on a substrate; a charge storage insulation layer between the control gate electrode and the substrate; a tunnel insulation layer between the charge storage insulation layer and the substrate; a blocking insulation layer between the charge storage insulation layer and the control gate electrode; and a material layer between the tunnel insulation layer and the blocking insulation layer, the material layer having an energy level constituting a bottom of a potential well.

In further embodiments of the present invention, the material layer may include a conductive material. In certain embodiments, a Fermi level of the conductive material in the material layer may be included in the energy level of the material layer and a work function of the conductive material may be greater than an electron affinity of the charge storage insulation layer.

In still further embodiments of the present invention, the material layer may include an insulating material. In certain embodiments, a bottom edge of a conduction band of the insulating material in the material layer may be included in an energy level of the material layer and an electron affinity of the insulating material may be greater than that of the charge storage insulation layer.

In some embodiments of the present invention, the insulating material in the material layer may include a trap and an energy difference between a bottom of the trap in the insulating material and a vacuum level may be greater than an energy difference between a bottom of a trap of the charge storage insulation layer and the vacuum level.

In further embodiments of the present invention, the insulating material in the material layer may have a higher dielectric constant than the tunnel insulation layer.

In still further embodiments of the present invention, the potential well may include an inner potential barrier generated by the charge storage insulation layer. The potential well may further include an inner potential barrier generated by the blocking insulation layer.

In some embodiments of the present invention, the potential well may further include an inner potential barrier generated by the tunnel insulation layer.

In further embodiments, the material layer may include a first layer between the tunnel insulation layer and the charge storage insulation layer and including an energy level constituting a bottom of a first potential well; and a second layer between the charge storage insulation layer and the blocking insulation layer and including an energy level constituting a bottom of a second potential well.

In still further embodiments, an electron affinity of the charge storage insulation layer may be greater than that of the blocking insulation layer.

Some embodiments of the present invention provide non-volatile memory devices including a tunnel insulation layer on a substrate; a blocking insulation layer on the tunnel insulation layer; a control gate electrode on the blocking insulation layer; and a first charge storage layer and a second charge storage layer between the tunnel insulation layer and the blocking insulation layer, the first charge storage layer including an insulating material with traps for storing charges, the second charge storage layer including a conductive charge storing material.

In further embodiments of the present invention, the second charge storage layer may have a larger charge storing capacity than the first charge storage layer.

In still further embodiments of the present invention, a potential barrier for charges in the second charge storage layer may be generated between the first and second charge storage layers.

In some embodiments of the present invention, the first charge storage layer may be between the tunnel insulation layer and the second charge storage layer, and the second charger storage layer may be between the first charge storage layer and the blocking insulation layer. In certain embodiments, a third charge storage layer may be included between the tunnel insulation layer and the first charge storage layer.

In further embodiments of the present invention, the second charge storage layer may be between the tunnel insulation layer and the first charge storage layer, and the first charge storage layer may be between the second charge storage layer and the blocking insulation layer.

In still further embodiments of the present invention, the second charge storage layer may include a semiconductor doped with dopants. In certain embodiments, charges stored in the second charge storage layer may have a type opposite to majority carriers in the doped semiconductor.

BRIEF DESCRIPTION OF THE DRAWINGS

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF EMBODIMENTS

Figure 1:
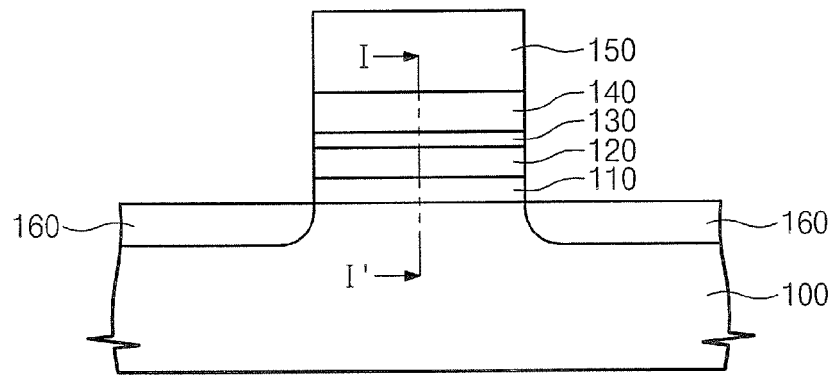
FIG. 1 is a cross-section illustrating a non-volatile memory device according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "lower" and "upper" or "upper," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Referring first to FIG. 1, a cross-section illustrating a non-volatile memory device according to some embodiments of the present invention will be discussed. As illustrated in FIG. 1, a control gate electrode 150 is disposed on a semiconductor substrate 100 (hereinafter, referred to as a substrate). The control gate electrode 150 may be disposed on an active region defined by a device isolation pattern (not shown) formed at the substrate 100. The active region may be a portion of the substrate 100 surrounded by the device isolation pattern. A charge storage insulation layer 120 is interposed between the control gate electrode 150 and the active region. A tunnel insulation layer 110 is interposed between the charge storage insulation layer 120 and the active region, and a blocking insulation layer 140 is interposed between the charge storage insulation layer 120 and the control gate electrode 150. A material layer 130 is interposed between the tunnel insulation layer 110 and the blocking insulation layer 140. According to some embodiments of the present invention, the material layer 130 may be interposed between the charge storage insulation layer 120 and the blocking insulation layer 140. Source/drain 160 may be disposed in the active regions on both sides of the control gate electrode 150. The source/drain 160 may be a region doped with a dopant. Unlike this, the source/drain 160 may be an inversion layer generated by a fringe field of the control gate electrode 150 during an operation of a non-volatile memory device. The tunnel insulation layer 110, the charge storage insulation layer 120, the material layer 130, the blocking insulation layer, the gate electrode 150 and the source/drain 160 may constitute a memory cell of a non-volatile memory device.

The charge storage insulation layer 120 may include traps for storing charges. For example, the charge storage insulation layer 120 may include at least one of SiN, SiON, and high-k dielectric materials such as an insulating metal oxide (e.g., a hafnium oxide or an aluminum oxide). According to some embodiments of the present invention, the charge storage insulation layer 120 may include metal trap sites. According to some embodiments of the present invention, the charge storage insulation layer 120 may include dots formed of one of a metal and a semiconductor. For example, the charge storage insulation layer 120 may include at least one of a dot formed of nano crystalline silicon, a dot formed of nano crystalline silicon-germanium, and a dot formed of a nano crystalline metal. Dots in the charge storage insulation layer 120 may be insulated from each other by using at least one of an oxide, a nitride, an oxide nitride, and a high-k dielectric. The charge storage insulation layer 120 may be formed by combining the above various materials.

The tunnel insulation layer 110 may include an oxide layer (e.g., a thermal oxide layer). The blocking insulation layer 140 may include an oxide layer. If the blocking insulation layer 140 includes only an oxide layer, it may be thicker than the tunnel insulation layer 110.

According to some embodiments of the present invention, the blocking insulation layer 140 may include a high-k dielectric layer having a higher dielectric constant than the tunnel insulation layer 110. For example, the blocking insulation layer 140 may include at least one of SiN, SiON, AlO, $Al_2O_3$, $HfO_2$, $La_2O_3$, $HfAl_xO_y$, HFAlON, $HfSi_xO_y$, HfSiON, $ZrO_2$, $ZrSi_xO_y$, $Ta_2O_3$, $TiO_2$, PZT, $PbTiO_3$, $PbZrO_3$, PbO, $SrTiO_3$, $BaTiO_3$, $V_2O_5$, $BST[(Ba, Sr)TiO_3]$, and $SBT(SrBi_2Ta_2O_9)$. An electric field is inversely proportional to a dielectric constant. That is, as the dielectric constant becomes higher, a lower electric field is formed, but as the dielectric constant becomes lower, a higher electric field is formed. Accordingly, when the blocking insulation layer 140 includes the high-k dielectric layer, an intensity of an electric field generated in the blocking insulation layer 140 may be less than that in the tunnel insulation layer 110 during a program operation and/or an erase operation. As a result, during the program operation and/or the erase operation, an amount of charges tunneling the blocking insulation layer 140 can be reduced. Therefore, a non-volatile memory device having excellent durability and low power consumption can be realized.

If the same electric field is applied to an insulation layer, as the thickness of the insulation layer becomes thicker, tunneling probability of charges through the insulation layer can be reduced. Accordingly, the thickness of the tunnel insulation layer 110 may be formed thinner than that of the blocking insulation layer 140. Therefore, during a program operation and/or an erase operation, an amount of changes tunneling the blocking insulation layer 140 can be reduced.

The control gate electrode 150 may include a conductive material having a work function of at least 4 eV. For example, the control gate electrode 150 includes at least one of silicon, silicon-germanium, Ti, TiN, TaN, TaTi, TaSiN, Ta, W, Hf, HfN, Nb, MO, $RuO_2$, RuO, $Mo_2N$, WN, WSi, $Ti_3Al$, $Ti_2AlN$, Pd, Ir, Pt, Co, Cr, CoSi, and AlSi. When the control gate electrode 150 includes a conductive material of more than 4 eV, an amount of charges tunneling from the control gate electrode 150 through the blocking insulation layer 140 can be reduced. Therefore, program efficiency of a non-volatile memory device can be improved.

The material layer 130 may have an energy level constituting the bottom of a potential well. Because the material layer 130 is interposed between the tunnel insulation layer 110 and the blocking insulation layer 140, the potential well is interposed between the tunnel insulation layer 110 and the blocking insulation layer 140. Due to the potential well by the material layer 130, leakage of charges stored in the charge storage insulation layer 120 is reduced such that a non-volatile memory device having excellent reliability can be realized. The material layer 130 may include a conductive material. This will be described in more detail with reference to energy band diagrams of FIGS. 2A and 2B.

Figure 2A:
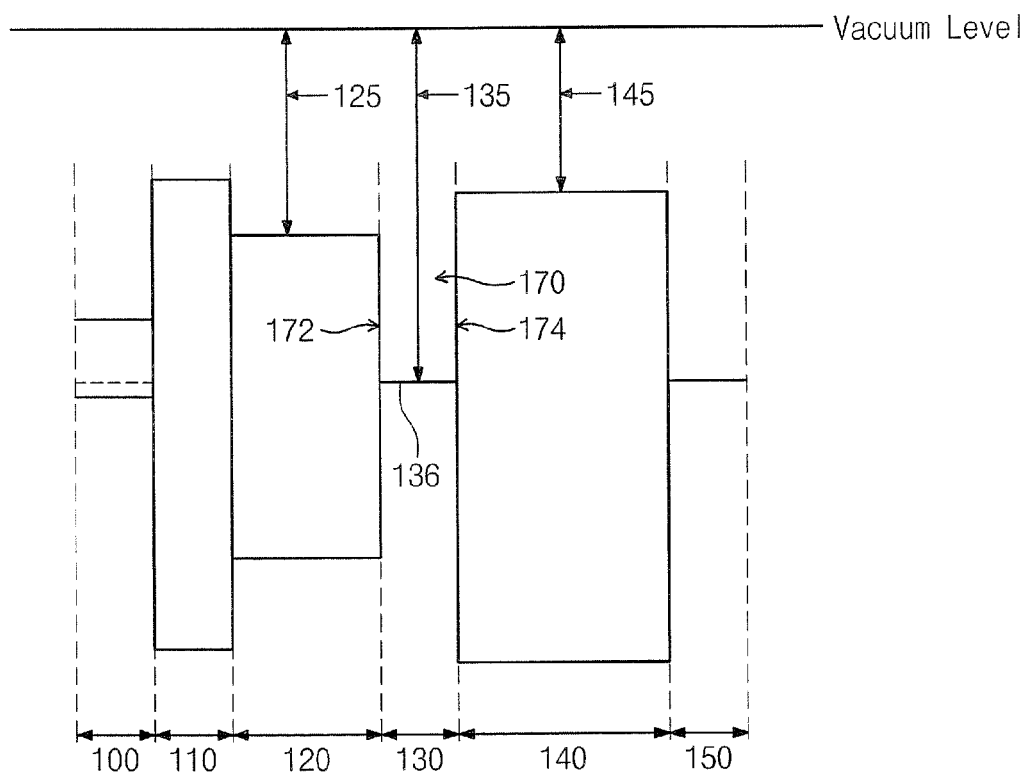
FIG. 2A is an energy band diagram taken along a line I-I' of FIG. 1 in an equilibrium state in embodiments of the present invention where the material layer of FIG. 1 includes a conductive material.

Referring now to FIG. 2A, an energy band diagram taken along a line I-I' of FIG. 1 in an equilibrium state if the material layer 130 of FIG. 1 includes a conductive material will be discussed. As illustrated in FIGS. 1 and 2A, the material layer 130 may include a conductive material having a higher word function 135 than the electron affinity 125 of the charge storage insulation layer 120. The electron affinity 125 of the charge storage insulation layer 120 may be defined by an energy difference between a vacuum level and the bottom edge of a conduction band of the charge storage insulation layer 120. The work function 135 of the conductive material in the material layer 130 may be defined by an energy difference between a vacuum level and a Fermi level 136 of the conductive material. At this point, the Fermi level 136 of the conductive material in the material layer 130 may be included in an energy level of the material layer 130 constituting the bottom of the potential well 170. The electron affinity 125 of the charge storage insulation layer 125 may be greater than the electron affinity 145 of the blocking insulation layer 140. The electron affinity 145 of the blocking insulation layer 140 may defined by an energy difference between the vacuum level and the bottom edge of the conduction band of the blocking insulation layer 140. When the electron affinity 125 of the charge storage insulation layer 120 is greater than the electron affinity 145 of the blocking insulation layer 140, a work function of the conductive material of the material layer 130 may be greater than the electron affinity 145 of the blocking insulation layer 140. The electron affinity 125 of the charge storage insulation layer 120 may be greater than the electron affinity of the tunneling insulation layer 110.

In the equilibrium state, the bands of the above layers 110, 120, 130, 140, and 150 may be substantially flat. Due to differences between word functions and electron affinities of the above layers 110, 120, 130, 140, and 150, the bands of the above layers 110, 120, 130, 140, and 150 may be partially bent in the equilibrium.

In some embodiments, the material layer 130 may be interposed between the charge storage insulation layer 120 and the blocking insulation layer 140. Accordingly, the potential well 170 may be interposed between the charge storage insulation layer 120 and the blocking insulation layer 140. The potential well 170 will be described in more detail. The potential well 170 includes a bottom, a first inner potential barrier 172, and a second inner potential barrier 174. The first and second inner potential barriers 172 and 174 may correspond to a potential barrier with aspect to the bottom of the potential well 170. As mentioned above, the bottom of the potential well 170 may include the Fermi level 136 of the conductive material. The first inner potential barrier 172 of the potential well 170 may be formed by the charge storage insulation layer 140, and the second inner potential barrier 174 of the potential well 170 may be formed by the blocking insulation layer 140. In particular, the material layer 130 may contact the charge storage insulation layer 120 and the blocking insulation layer 140. At this point, the first inner potential barrier 172 may correspond to an interface potential barrier between the charge storage insulation layer 120 and the material layer 130, and the second inner potential barrier 174 may correspond to an interface potential barrier between the material layer 130 and the blocking insulation layer 140. Due to the potential well 170, a phenomenon that charges stored in the charge storage insulation layer 120 leak in an equilibrium state can be reduced. Especially, because the potential well 170 is interposed between the charge storage insulation layer 120 and the blocking insulation layer 140, a phenomenon that charges stored in the charge storage insulation layer 120 leak through the blocking insulation layer 140 can be reduced. Accordingly, data detention characteristic of a non-volatile memory device can be improved. As a result, a non-volatile memory device having excellent reliability can be realized.

A difference between the electron affinity 125 of the charge storage insulation layer 120 and the electron affinity 145 of the blocking insulation layer 140 may be small. If the material layer 130 is omitted (i.e., if the charge storage insulation layer 120 directly contacts the blocking insulation layer 140), charges stored in the charge storage insulation layer 120 may be excited by an external environment (e.g., thermal excitation or noise) such that they can leak into the control gate electrode 150 from the conduction band of the charge storage insulation layer 120 through the conduction band of the blocking insulation layer 140. This is caused by a low potential barrier between the charge storage insulation layer 120 and the blocking insulation layer 140 (i.e., a small difference between their electron affinities 125 and 145). However, according to the present invention, the potential well 170 is formed by the material layer 130 and has very large inner potential barriers 172 and 174. Accordingly, a phenomenon that excited charges leak through the blocking insulation layer 140 can be reduced.

The conductive material of the material layer 130 may be a conductive material whose work function is at least 4 eV. The conductive material of the material layer 130 may include a metal. For example, the conductive material may include at least one of Ti, TiN, TaN, TaTi, TaSiN, Ta, W, Hf, HfN, Nb, MO, $RuO_2$, RuO, $Mo_2N$, WN, WSi, $Ti_3Al$, $Ti_2AlN$, Pd, Ir, Pt, Co, Cr, CoSi, and AlSi. Additionally, the material layer 130 may include semiconductor (e.g., silicon, germanium or silicon-germanium) whose work function is at least 4 eV.

Figure 2B:
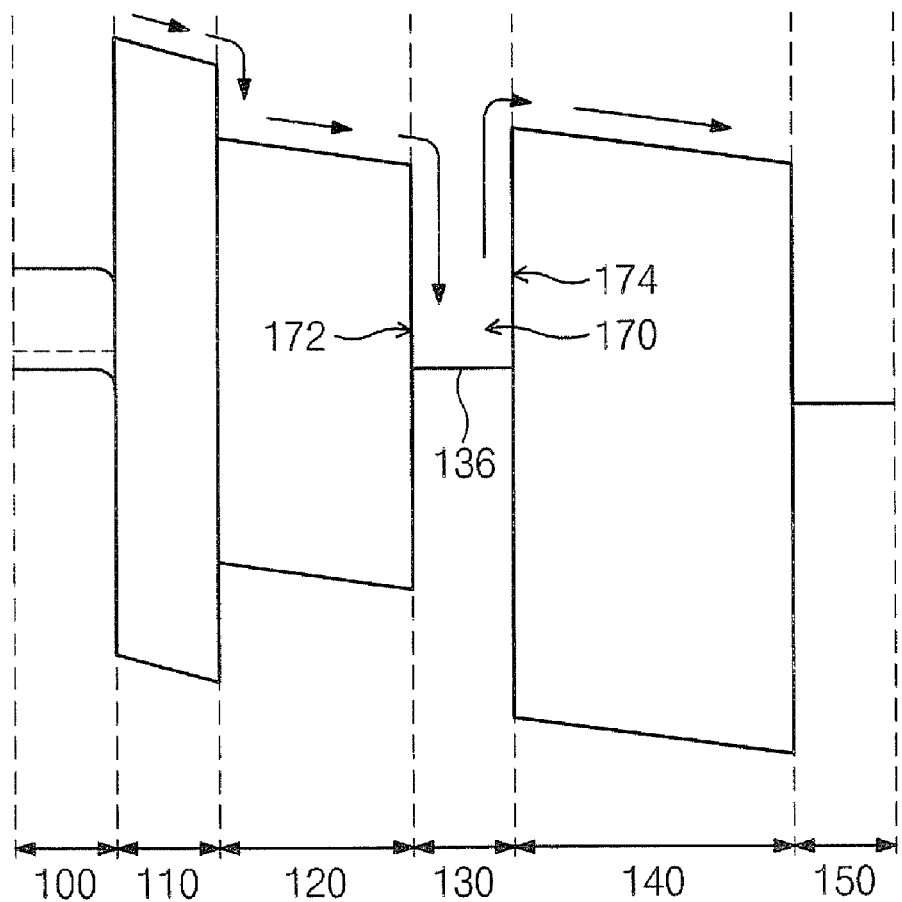
FIG. 2B is an energy band diagram taken along a line I-I' of FIG. 1 during a program operation in embodiments of the present invention where the material layer of FIG. 1 includes a conductive material.

Referring now to FIG. 2B, an energy band diagram taken along a line I-I' of FIG. 1 during a program operation if the material layer 130 of FIG. 1 includes a conductive material will be discussed. As illustrated in FIGS. 1 and 2B, during a program operation, the energy band diagram can be bent by applying a program voltage between the control gate electrode 150 and the substrate 100. FIG. 2B illustrates a state where a positive voltage is applied to the control gate electrode 150. In these embodiments, due to the positive voltage applied to the control gate electrode 150, a work function 136 of the conductive material of the material layer 130 may be lowered. Therefore, the heights of the inner potential barriers 172 and 174 of the potential well 170 may be increased. Especially, the height of the second inner potential barrier 174 can be increased. Thus, during the program operation, a phenomenon that charges stored in the charge storage insulation layer 120 leak through the blocking insulation layer 140 can be reduced. As a result, program efficiency of a non-volatile memory device can be improved. Because the program efficiency is improved, a program operating voltage can be reduced, and also because a program time can be reduced, the damage of the tunnel insulation layer 110 can be reduced. Accordingly, a non-volatile memory device having excellent reliability can be realized and also a non-volatile memory device having lower power consumption and/or fast operating speed can be realized.

Figure 3A:
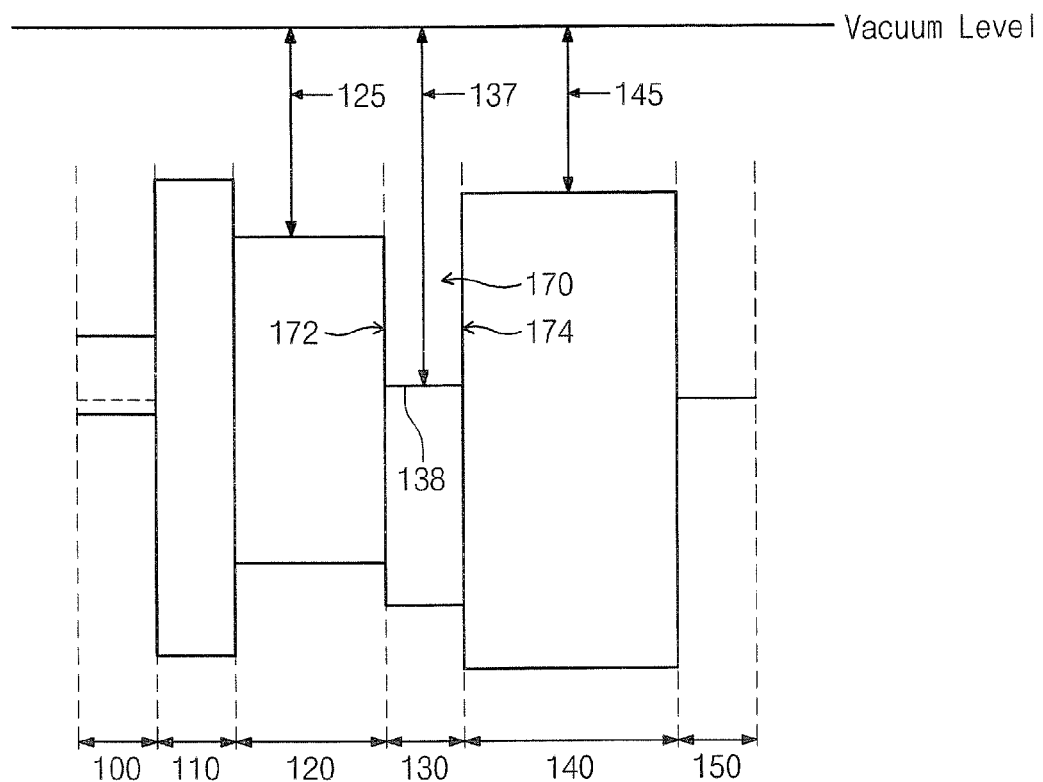
FIG. 3A is an energy band diagram taken along a line I-I' of FIG. 1 in an equilibrium state in embodiments of the present invention where the material layer of FIG. 1 includes an insulating material.
Figure 3B:
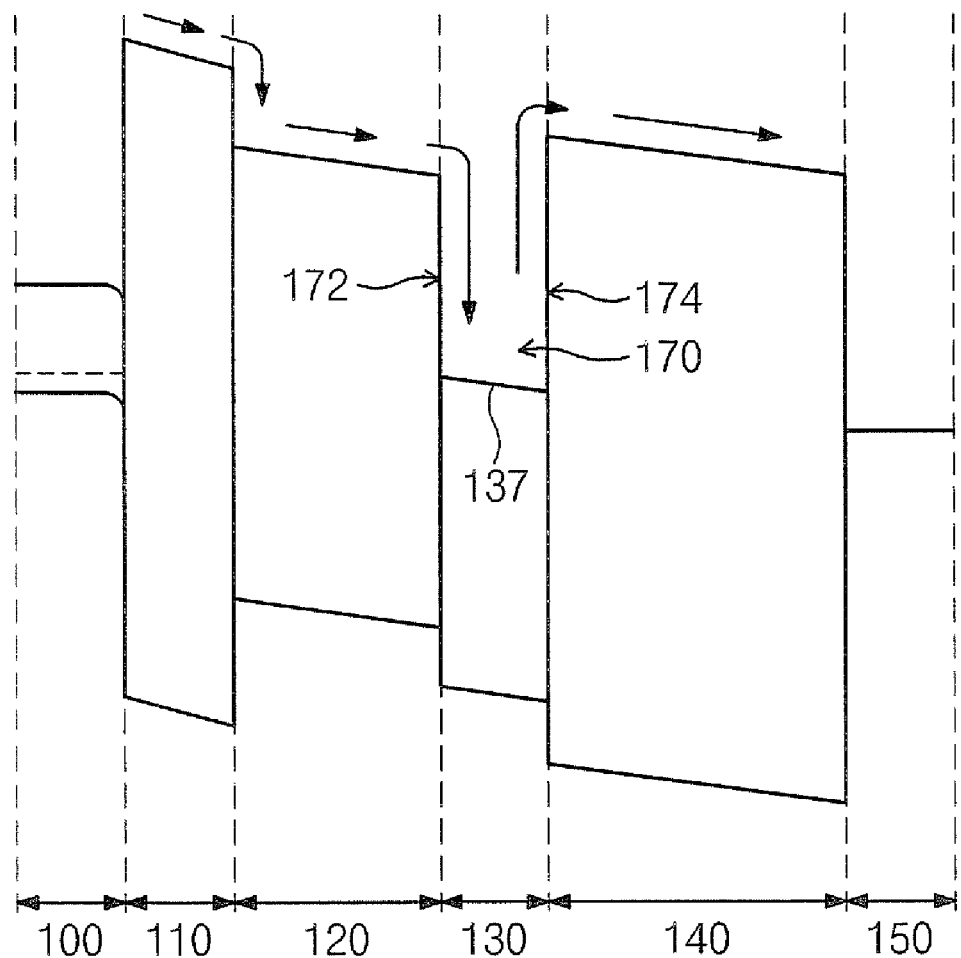
FIG. 3B is an energy band diagram taken along a line I-I' of FIG. 1 during a program operation in embodiments of the present invention where the material layer of FIG. 1 includes an insulating material.

On the other hand, the material layer 130 may include an insulating material, which will be discussed with reference to FIGS. 3A and 3B. FIG. 3A is an energy band diagram taken along a line I-I' of FIG. 1 in an equilibrium state if the material layer of FIG. 1 includes an insulating material. FIG. 3B is an energy band diagram taken along a line I-I' of FIG. 1 during a program operation if the material layer of FIG. 1 includes an insulating material.

Referring now to FIGS. 1 and 3A, the material layer 130 may include an insulating material having the higher electron affinity 137 than the electron affinity 125 of the charge storage insulation layer 120. The electron affinity 137 of the insulating material may be defined by an energy difference between a vacuum level and the bottom edge 138 of a conduction band of the insulating material. The bottom edge 138 of a conduction band of the insulating material is included in an energy level of the material layer 130 constituting the bottom of the potential well 170. The electron affinity 125 of the charge storage insulation layer 120 may be greater than the electron affinity 145 of the blocking insulation layer 140. Therefore, the electron affinity 137 of the insulating material is greater than the electron affinity 145 of the blocking insulation layer 140. The potential well 170 may include a bottom formed of the bottom edge 138 of the conduction band of the insulating material, a first inner potential barrier 172, and a second inner potential barrier 174.

In an equilibrium state, a phenomenon that charges stored in the charge storage insulation layer 120 leak through the blocking insulation layer 140 can be reduced by the potential well 170 having the bottom edge 138 in the material layer 130 as its own bottom. Therefore, data detention characteristic of a non-volatile memory device can be improved.

The insulating material in the material layer 130 may include traps. At this point, an energy difference between the vacuum level and the bottom of the trap of the insulating material in the material layer 130 may be greater than an energy difference between the vacuum level and the bottom of the trap of the charge storage insulation layer 120. Accordingly, even if charges stored in the charge storage insulation layer 120 are excited, a phenomenon that excited charges leak through the blocking insulation layer 140 may be more reduced due to the traps of the insulation material in the material layer 130. Furthermore, the insulating material in the material layer 130 may have a higher dielectric constant than the tunnel insulation layer 110. For example, the insulating material in the material layer 130 may include at least one of TaO, BaTiO, ZrO, HfO, YO, and ZrSiO.

As illustrated in FIG. 3B, during a program operation in which a positive voltage is applied to the control gate electrode 150, at least a portion of the bottom of the conduction band of the insulating material in the material layer 130 may be lowered. Especially, a portion of the bottom edge of the conduction band of the insulating material, adjacent to the blocking insulation layer 140, may be lowered. Therefore, the height of the second inner potential barrier 174 of the potential well 170 can be increased. As a result, a phenomenon that charges stored in the charge storage insulation layer 120 leak through the blocking insulation layer 140 can be more reduced.

As mentioned-above, the material layer 130 includes the conductive material having the Fermi level corresponding to the bottom of the potential well 170, or the insulating material having the bottom edge of the conduction band corresponding to the bottom of the potential well 170. According to some embodiments of the present invention, the material layer 130 may include all of the conductive material and the insulating material. In these embodiments, the conductive material and the insulating material can be sequentially stacked in the material layer 130. Charges for data may be in potential wall 170 of FIGS. 2A, 2B, 3A and 3B, and/or the traps of the insulating material in the material layer 130 of FIGS. 3A and 3B as well as the charge storage insulation layer 120.

Figure 4:
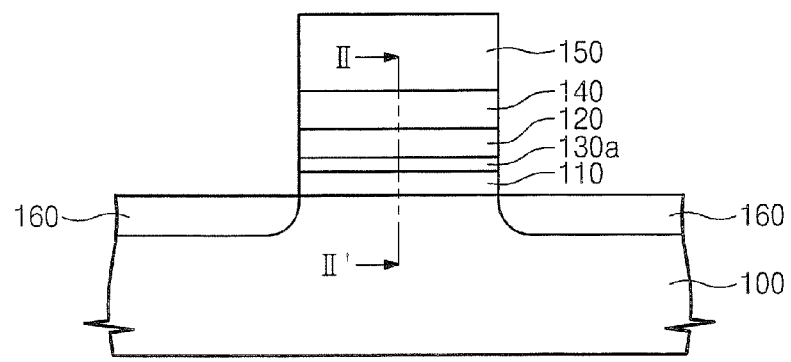
FIG. 4 is a cross-section of non-volatile memory devices according to some embodiments of the present invention.

Some embodiments provide a non-volatile memory device capable of minimizing charges that leak through a tunnel insulation layer. Referring now to FIG. 4, a cross-section of a non-volatile memory device according to some embodiments of the present invention will be discussed. As illustrated in FIG. 4, a control gate electrode 150 is disposed on an active region of a substrate 100, and a charge storage insulation layer 120 is interposed between the control gate electrode 150 and the active region. A tunnel insulation layer 110 is interposed between the charge storage insulation layer 120 and the active region, and a blocking insulation layer 140 is interposed between the charge storage insulation layer 120 and the control gate electrode 150. A material layer 130a may be interposed between the tunnel insulation layer 110 and the charge storage insulation layer 120. The material layer 130a may have an energy level constituting the bottom of the potential well 170a. The material layer 130a will be described in more detail with reference to FIGS. 5A and 5B. The tunnel insulation layer 110, the charge storage insulation layer 120, the material layer 130a, the blocking insulation layer, the gate electrode 150 and source/drains 160 may constitute a memory cell of a non-volatile memory device.

Figure 5A:
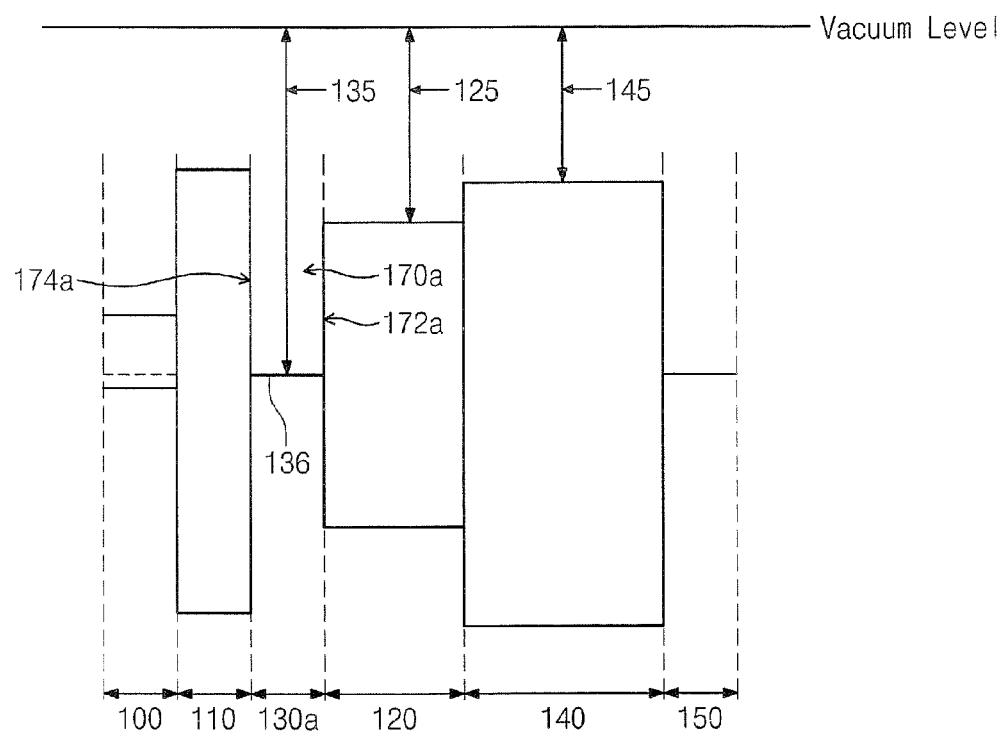
FIG. 5A is an energy band diagram taken along a line II-II' of FIG. 4 in an equilibrium state in embodiments of the present invention where the material layer of FIG. 4 includes a conductive material.
Figure 5B:
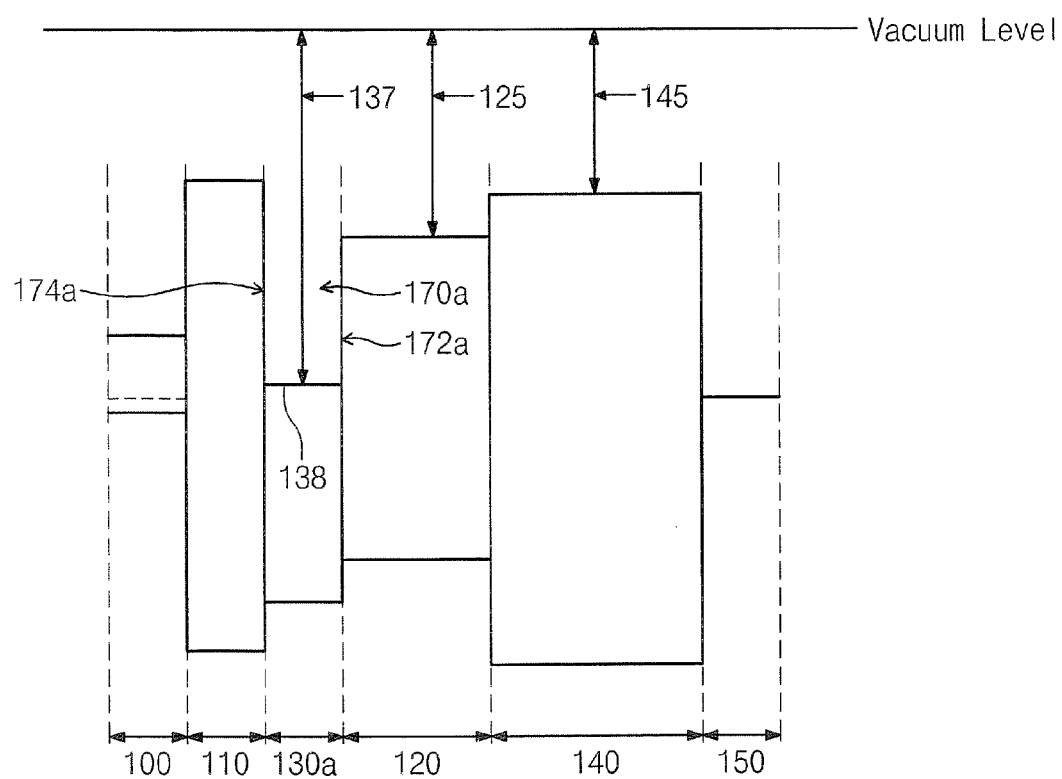
FIG. 5B is an energy band diagram taken along a line II-II' of FIG. 4 in an equilibrium state in embodiments of the present invention where the material layer of FIG. 4 includes an insulating material.

FIG. 5A is an energy band diagram taken along a line II-II' of FIG. 4 in an equilibrium state if the material layer 130a of FIG. 4 includes a conductive material. FIG. 5B is an energy band diagram taken along a line II-II' of FIG. 4 in an equilibrium state if the material layer 130a of FIG. 4 includes an insulating material.

Referring now to FIGS. 4 and 5A, the material layer 130a may include a conductive material. Especially, the conductive material in the material layer 130a may have a larger work function 135 than the electron affinity 125 of the charge storage insulation layer 120. At this point, a Fermi level 136 of the conductive material in the material layer 130a may correspond to the bottom of a potential well 170a. The conductive material in the material layer 130a may have the same material as the conductive material in the material layer 130 of FIGS. 1 and 2A.

Because the material layer 130a is interposed between the charge storage insulation layer 120 and the tunnel insulation layer 110, the potential well 170a may be disposed between the charge storage insulation layer 120 and the tunnel insulation layer 110. As discussed above, the electron affinity of the charge storage insulation layer 120 may be greater than the electron affinity 125 of the tunnel insulation layer 110. Accordingly, the potential well 170a includes a first inner potential barrier 172a and a second inner potential barrier 174a. The first inner potential barrier 172a can be formed by the charge storage insulation layer 120 and the second inner potential barrier 174a can be formed by the tunnel insulation layer 110. For example, the first inner potential barrier 172a may correspond to an interface barrier between the charge storage insulation layer 120 and the material layer 130a, and the second inner potential barrier 174a corresponds to an interface barrier between the material layer 130a and the tunnel insulation layer 110.

Due to the potential well 170a formed by the material layer 130a, a phenomenon that charges stored in the charge storage insulation layer 120 leak through the tunnel insulation layer 110 can be reduced. Accordingly, data detention characteristic of a non-volatile memory device can be improved. As a result, a non-volatile memory device having excellent reliability can be realized.

Referring now to FIGS. 4 and 5B, the material layer 130a may include an insulating material. The insulating material in the material layer 130a may have a greater electron affinity 137 than the electron affinity 125 of the charge storage insulation layer 120. The bottom edge 138 of a conduction band of the insulating material in the material layer 130a may constitute the bottom of the potential well 170a. The insulating material in the material layer 130a may include traps. An energy difference between a vacuum level and traps of the insulating material in the material layer 130a may be greater than an energy difference between the vacuum level and traps of the charge storage insulation layer 120. The insulating material in the material layer 130a may have a higher dielectric constant than the tunnel insulation layer 110. The insulating material in the material layer 130a may be formed of the same material as the insulating material in the material layer 130 of FIGS. 1 and 3A.

According to some embodiments of the present invention, the material layer 130a may include the conductive material of FIG. 5A and the insulating material of FIG. 5B.

According to some embodiments, the material layer 130a may be interposed between the tunnel insulation layer 110 and the charge storage insulation layer 120. Thereby, the potential well 170a may be interposed between the tunnel insulation layer 110 and the charge storage insulation layer 120. Thus, a phenomenon that charges stored in the charge storage insulation layer 120 leak through the tunnel insulation layer can be reduced. Charges for data may be stored in the potential well 170a of FIGS. 5A and 5B and/or the traps of the insulating material in the material layer 130a of FIG. 5B as well as the charge storage insulation layer 120.

Figure 6:
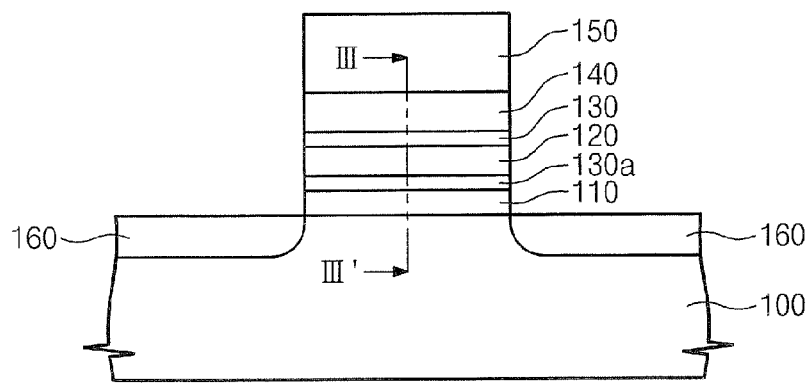
FIG. 6 is a cross-section of non-volatile memory devices according to some embodiments of the present invention.
Figure 7:
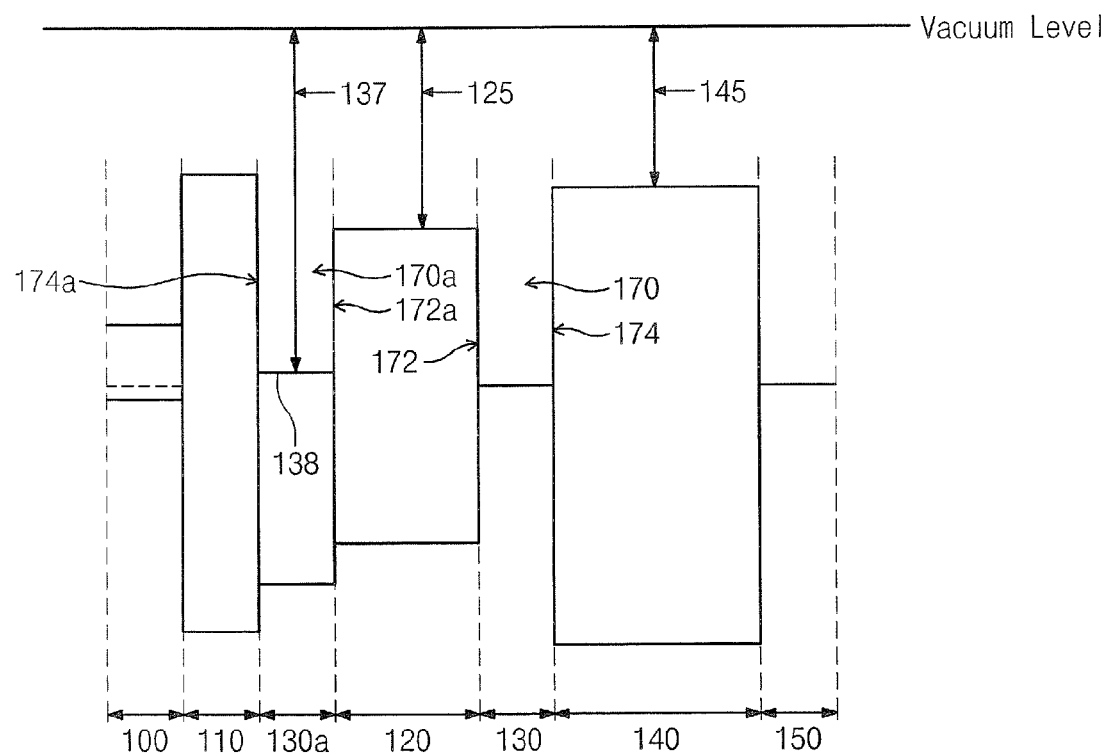
FIG. 7 is an energy band diagram taken along a line III-III' of FIG. 6 in an equilibrium state in accordance with some embodiments of the present invention.

Some embodiments of the present invention provide a non-volatile memory device capable of minimizing a phenomenon that charges stored in a charge storage insulation layer leak through a tunnel insulation layer and a blocking insulation layer. FIG. 6 is a cross-section of a non-volatile memory device according to some embodiments of the present invention. FIG. 7 is an energy band diagram taken along a line III-III' of FIG. 6 in an equilibrium state.

Referring now to FIGS. 6 and 7, a control gate electrode 150 is disposed on an active region defined in a substrate 100, and a charge storage insulation layer 120 is interposed between the control gate electrode 150 and the active region. A tunnel insulation layer 110 is interposed between the charge storage insulation layer 120 and the active region, and the blocking insulation layer 140 is interposed between the charge storage insulation layer 120 and the control gate electrode 150. Source/drain 160 is disposed in the active regions adjacent to both sides of the control gate electrode 150.

A first material layer 130a and a second material layer 130 are interposed between the tunnel insulation layer 110 and the blocking insulation layer 140. In particular, the first material layer 130a is interposed between the tunnel insulation layer 110 and the charge storage insulation layer 120 to form a first potential well 170a. The second material layer 130 is interposed between the charge storage insulation layer 120 and the blocking insulation layer 140 to form a second potential well 170. The tunnel insulation layer 110, the charge storage insulation layer 120, the first material layer 130a, the second material layer 130, the blocking insulation layer, the gate electrode 150 and a source/drain 160 may constitute a memory cell of a non-volatile memory device.

The first material layer 130a may be the same as embodiments discussed above. That is, the first material layer 130a may include at least one of the insulating material and the conductive material explained in embodiments discussed above. Likewise, the second material layer 130 may be the same as the embodiments discussed above. In particular, the second material layer 130 may include at least one of the insulating material and the conductive material explained above.

In the energy band diagram of FIG. 7, the first material layer 130a includes an insulating material having the higher electron affinity 135 than the electron affinity 125 of the charge storage insulation layer 120, and the second material layer 130 includes a higher work function 137 than the electron affinity 125 of the charge storage insulation layer 120.

According to some embodiments, due to the first potential well 170a formed by the first material layer 130a, a phenomenon that charges stored in the charge storage insulation layer 120 leak through the tunnel insulation layer 110 can be reduced. Additionally, due to the second potential well 170 formed by the second material layer 130, a phenomenon that charges stored in the charge storage insulation layer 120 leak through the blocking insulation layer 140 can be reduced. Therefore, data detention characteristic of a non-volatile memory device can be improved. Additionally, due to the second potential well 170, program efficiency can be improved. Consequently, a non-volatile memory device having excellent reliability and low power consumption can be realized.

Figure 8:
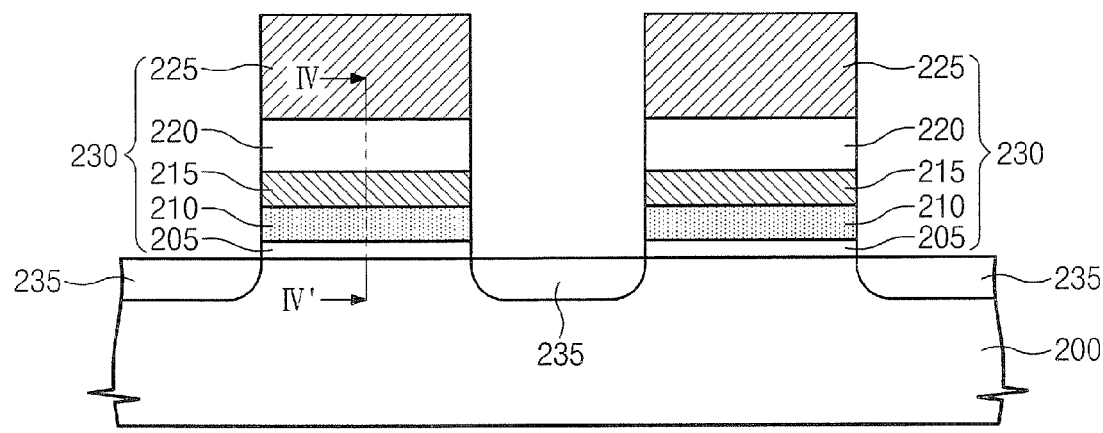
FIG. 8 is a cross-section of non-volatile memory devices according to some embodiments of the present invention.

FIG. 8 is a cross-section of a non-volatile memory device according to some embodiments of the present invention. As illustrated in FIG. 8, a plurality of gate patterns 230 are disposed on a semiconductor substrate 200 (hereinafter, referred to as a substrate). A device isolation pattern (not shown) may be formed in the substrate 200 to define an active region. The active region may be a portion of the substrate 200 surrounded by the device isolation pattern. The active region may be doped with dopants of a first conductive type. The gate patterns 230 may be disposed on the active region. The gate patterns 230 may be laterally spaced apart from each other. Each of the gate patterns 230 includes a tunnel insulation layer 205, a first charge storage layer 210, a second charge storage layer 215, a blocking insulation layer 220, and a control gate electrode 225. The blocking insulation layer 220 is disposed on the tunnel insulation layer 205, and the first and second charge storage layers 210 and 215 are interposed between the tunnel insulation layer 205 and the blocking insulation layer 220. The control gate electrode 225 is disposed on the blocking insulation layer 220. As illustrated in FIG. 1, the first and second charge storage layers 210 and 215 may be sequentially stacked. That is, the first charge storage layer 210 may be interposed between the tunnel insulation layer 205 and the second charge storage layer 215, and the second charge storage layer 215 may be interposed between the first charge storage layer 210 and the blocking insulation layer 220.

A source/drain 235 is disposed on the active regions at both sides of the control gate electrode 225. The source/drain 235 may be an area doped with a dopant of a second conductive type. Unlike this, the source/drain 235 may be an inversion layer that is formed by a fringe electric field, which is generated by applying an operating voltage to the control gate electrode 225. Each of the gate patterns 230 and the source/drain 235 adjacent to the both sides of the gate pattern 230 may constitute a memory cell of a non-volatile memory device.

The tunnel insulation layer 205 may include an oxide (e.g., a thermal oxide). The blocking insulation layer 220 may include a high-k dielectric having a higher dielectric constant than the tunnel insulation layer 205. For example, the blocking insulation layer 220 includes at least one of SiN, SiON, AlO, $Al_2O_3$, $HfO_2$, $La_2O_3$, $HfAl_xO_y$, HfAlON, $HfSi_xO_y$, HfSiON, $ZrO_2$, $ZrSi_xO_y$, $Ta_2O_3$, $TiO_2$, PZT, $PbTiO_3$, $PbTiO_3$, $PbZrO_3$, PbO, $SrTiO_3$, $BaTiO_3$, $V_2O_5$, BST[(Ba, Sr)$TiO_3$] and SBT($SrBi_2Ta_2O_9$). An electric field may be inversely proportional to a dielectric constant. That is, as a dielectric constant of a material is higher, a lower electric field occurs in the material, and as a dielectric constant of a material is lower, a higher electric field occurs in the material. Accordingly, if the blocking insulation layer 220 includes the high-k dielectric material, an intensity of an electric field generated in the blocking insulation layer 220 may be less than that in the tunnel insulation layer 205 during a program operation and/or an erase operation. As a result, during the program operation and/or the erase operation, an amount of charges tunneling through the blocking insulation layer 220 can be reduced. Therefore, a non-volatile memory device having excellent durability and lower power consumption can be realized.

When a same electric field is applied to an insulation layer, as the thickness of the insulation layer is thicker, tunneling probability of charges through the insulation layer may be lower. Accordingly, the thickness of the tunnel insulation layer 205 may be formed thinner than that of the blocking insulation layer 220. Therefore, an amount of charges tunneling during a program operation and/or an erase operation can be reduced. According to some embodiments of the present invention, the blocking insulation layer 220 may include an oxide. If the blocking insulation layer 220 includes only an oxide, it may be thicker than the tunnel insulation layer 205.

The first charge storage layer 210 may include an insulating material with traps for storing charges. For example, the first charge storage layer 210 may include at least one of silicon nitride, silicon oxide nitride, and a high-k dielectric (e.g., insulating metal oxide, etc.). According to some embodiments of the present-invention, the first charge storage layer 210 may include metal trap sites. According to some embodiments of the present invention, the first charge storage layer 210 may include an insulating material (e.g., oxide, nitride and/or oxide nitride, etc.) including dots formed of at least one of a metal and a semiconductor.

The second charge storage layer 215 may include a conductive charge storing material. According to some embodiments of the present invention, a charge storing capacity of the second charge storage layer 215 may be greater than that of the first charge storage layer 210. The second charge storage layer 215 may include a semiconductor doped with a dopant. For example, the second charge storage layer 215 includes at least one of doped silicon, doped germanium, and doped silicon-germanium. The present invention is not limited thereto. The second charge storage layer 215 may include another conductive material for storing charges. For example, the second charge storage layer 215 may include the same material as the conductive material in the material layer 130 of FIGS. 1 and 2A.

The tunnel insulation layer 205 and the first charge storage layer 210 may laterally extend. Therefore, the tunnel insulation layers 205 and the first charge storage layers 210 of the gate patterns 230 may be connected to each other. At this point, the second charge storage layer 215 including a conductive charge storing material may be separated from the adjacent another second charge storage layer 215.

The control gate electrode 225 may include a conductive material whose work function is at least 4 eV. That is, the control gate electrode 225 may include a conductive material whose work function is more than 4 eV. For example, the control gate electrode 225 may include at least one of silicon, silicon-germanium, Ti, TiN, TaN, TaTi, TaSiN, Ta, W, Hf, HfN, Nb, MO, $RuO_2$, RuO, $Mo_2N$, WN, WSi, $Ti_3Al$, $Ti_2AlN$, Pd, Ir, Pt, Co, Cr, CoSi, and AlSi. Because the control gate electrode 225 includes a conductive material of more than 4 eV, an amount of charges tunneling from the control gate electrode 225 through the blocking insulation layer 220 can be reduced. Therefore, program efficiency of a non-volatile memory device can be improved.

In the above non-volatile memory device, each of the gate patterns 230 includes a first charge storage layer 210 including an insulating material with traps and a second charge storage layer 215 including a conductive charge storing material. That is, a portion (i.e., the first charge storage layer 210) of an area where charges are stored in the gate pattern 230 has an insulating property and another portion (i.e., the second charge storage layer 215) has a conductive property. Therefore, an interference phenomenon (e.g., a parasite capacity) between the gate patterns 230 can be reduced. If an entire area storing charges in the gate patterns 230 have a conductive property, parasite capacitances of adjacent gate patterns 230 may be increased. Unlike this, because a portion (i.e., the first charge storage layer 210) of an area storing charges of the gate pattern 230 according to the present invention has an insulating property, an interference phenomenon such as a parasite capacitance between the adjacent gate patterns 230 can be reduced. Moreover, the second charge storage layer 215 may have a higher charge storing capacity than the first charge storage layer 210. Accordingly, compared to when an entire area storing charges of the gate pattern 230 is formed of an insulating material, charge storing capacities of the first and second charge storage layers 210 and 215 are increased. As a result, as a charge storing capacity of the gate pattern 230 increases, program efficiency of a non-volatile memory device can be improved.

Moreover, because each of the gate patterns 230 includes the first and second charge storage layers 210 and 215, a leakage phenomenon of charges stored in the gate pattern 230 can be reduced. In particular, since all of the first charge storage layer 210 and the blocking insulation layer 220 include an insulating material, a first energy band offset may be small between the first charge storage layer 210 and the blocking insulation layer 220. The first energy band offset may be defined by an energy difference between an energy band of the first charge storage layer 210 and an energy band of the blocking insulation layer 220. For example, the first energy band offset may be an energy difference between the bottom edge of a conduction band of the first charge storage layer 210 and the conduction band bottom edge of the blocking insulation layer 220. Charges stored in the first charge storage layer 210 may be excited by an external environment (e.g., heat or noise). At this point, if the second charge storage layer 215 is omitted, the excited charges may leak through the blocking insulation layer 220 because the first energy band offset is small. However, according to the present invention, the second charge storage layer 220 is disposed between the first charge storage layer 210 and the blocking insulation layer 220. Accordingly, the excited charges can be stored in the second charge storage layer 215. Moreover, the second charge storage layer 215 includes a conductive charge storing material. Especially, according to some embodiments of the present invention, the second charge storage layer 215 may include a doped semiconductor. The doped semiconductor has a less energy band gap compared to the first charge storage layer 210 including an insulating material. Accordingly, the second energy band offset between the second charge storage layer 215 and the blocking insulation layer 220 is greater than the first energy band offset. As a result, a leakage phenomenon of charges in each of the gate patterns 230 can be reduced. Since a leakage phenomenon of charges is reduced, program efficiency of a non-volatile memory device can be improved.

Furthermore, since the second charge storage layer 215 has a conductive charge storing material, voltage drop due to the thickness of the second charge storage layer 215 may not occur substantially when an operating voltage is applied to the control gate electrode 225. As a result, an operating voltage of a non-volatile memory device can be reduced by forming a portion of an area storing charges of the gate pattern 230 with a conductive material.

Moreover, according to some embodiments, the first charge storage layer 210 including an insulating material is adjacent to the tunnel insulation layer 205. The first charge storage layer 210 may include traps where charges are separated from each other. Therefore, the thickness of the tunnel insulation layer 205 can be reduced. That is, because the first charge storage layer 210 is directly disposed on the tunnel insulation layer 205, the thickness of the tunnel insulation layer 205 can be reduced. Therefore, an operating voltage of a non-volatile memory device can be reduced.

According to some embodiments of the present invention, charges stored in the first and/or second charge storage layers 210 may be the same type as the majority carrier of the doped semiconductor in the second charge storage layer 215. For example, charges stored in the second charge storage layer 215 may be electrons, and the doped semiconductor in the second charge storage layer 215 may be doped with an n-type dopant. Unlike this, charges stored in the second charge storage layer 215 are holes, and the doped semiconductor in the second charge storage layer 215 may be doped with a p-type dopant. This will be described in more detail with reference to an energy band diagram of FIG. 9A.

Figure 9A:
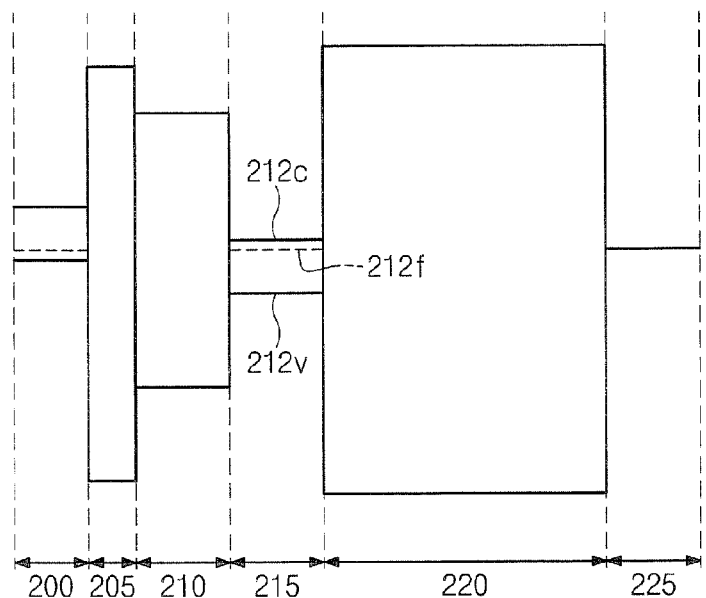
FIG. 9A is an energy band diagram taken along a line IV-IV' of FIG. 8 in accordance with some embodiments of the present invention.

FIG. 9A is an energy band diagram taken along a line IV-IV' of FIG. 8. For convenience of description, the energy band diagram of FIG. 9A illustrates a case where stored charges are electrons and the second charge storage layer 215 includes a semiconductor doped with an n-type dopant. Because the stored charges are electrons in FIG. 9A, the substrate 200 may be doped with a p-type dopant. FIG. 9A shows an energy band diagram in an equilibrium state. In the equilibrium state, energy bands of the combined substrate 200, layers 205, 210, 215, and 220, and control gate electrode 225 may be partially bent or inclined due to differences between their work functions. The energy band diagram of FIG. 9A may be simplified for convenience of description.

Referring to FIGS. 8 and 9A, the second charge storage layer 215 including a semiconductor doped with an n-type dopant includes the conduction band bottom edge $212c$ and the valence band top edge $212v$. A gap between the conduction band bottom edge $212c$ and the valence band top edge $212v$ corresponds to an energy band gap. A Fermi level $212f$ of the second charge storage layer 215 including a semiconductor doped with an n-type dopant is adjacent to the conduction band bottom edge $212c$.

An energy band gap of the second charge storage layer 215 may be less than that of the first charge storage layer 210 including an insulating material. Therefore, a first potential barrier for electrons in the second charge storage layer 215 may be formed between the first and second charge storage layers 210 and 215. Because the second charge storage layer 215 includes a semiconductor doped with an n-type dopant, electrons in the second charge storage layer 215 may be stored in a higher conduction band than the Fermi level $212f$. For example, electrons in the second charge storage layer 215 may be adjacent to the conduction band bottom edge $212c$. The first potential barrier has the height from the conduction band bottom edge $212c$ of the second charge storage layer 215 to the conduction band bottom edge of the first charge storage layer 210. Electron affinity of the second charge storage layer 215 is greater than that of the first charge storage layer 210.

An energy band gap of the second charge storage layer 215 is smaller than that of the blocking insulation layer 220 including an insulating material. Accordingly, a second potential barrier for electrons in the second charge storage layer 215 may be formed between the second storage layer 215 and the blocking insulation layer 220. The second potential barrier may have the height from the conduction band bottom edge $212c$ of the second charge storage layer 215 to the conduction bottom edge of the blocking insulation layer 220. Electron affinity of the second charge storage layer 215 is greater than that of the blocking insulation layer 220. Electron affinity of the first charge storage layer 210 may be greater than that of the blocking insulation layer 220. Therefore, the second potential barrier may be larger than the first potential barrier. Electron affinity of the first charge storage layer 210 may be greater than that of the tunneling insulation layer 205.

As mentioned above, when charges stored in the first charge storage layer 210 are excited, they may be stored in the second charge storage layer 215. Additionally, due to the second potential barrier between the second charge storage layer 215 and the blocking insulation layer 220, a phenomenon that charges stored in the second charge storage layer 215 leak through the blocking insulation layer 220 can be reduced.

According to some embodiments of the present invention, charges stored in the first and/or second charge storage layers 210 and 215 may have a different type from majority carriers of the doped semiconductor included in the second charge storage layer 215. For example, charges stored in the second charge storage layer 215 are electrons, and the doped semiconductor included in the second charge storage layer 215 may be doped with a p-type dopant. Unlike this, charges stored in the second charge storage layer 215 are electron holes, and the doped semiconductor included in the second charge storage layer 215 may be doped with an n-type dopant. This will be described in more detail with reference to an energy band diagram of FIG. 9B.

Figure 9B:
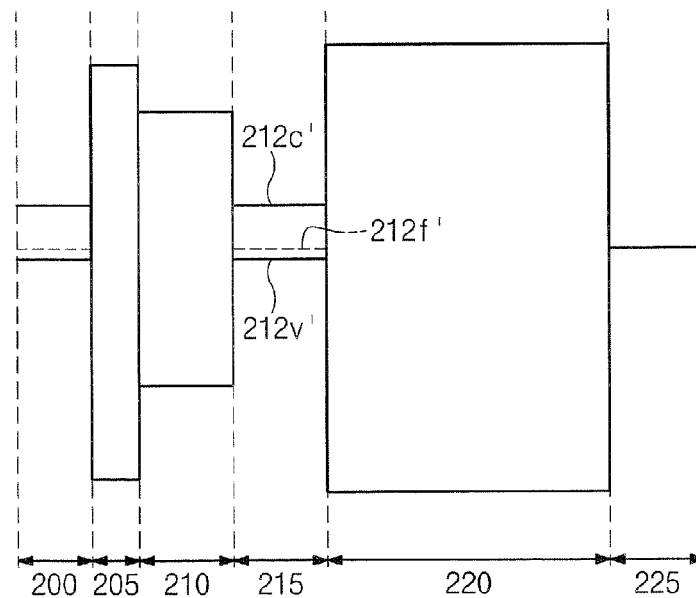
FIG. 9B is an energy band diagram taken along a line IV-IV' of FIG. 8 in accordance with some embodiments of the present invention.

FIG. 9B is another energy band diagram taken along a line IV-IV' of FIG. 8. For convenience of description, the energy band diagram of FIG. 9B illustrates a case where stored charges are electrons and the second charge storage layer 215 includes a semiconductor doped with a p-type dopant. Because the stored charges are electrons in FIG. 9B, the substrate 200 may be doped with a p-type dopant. FIG. 9B shows an energy band diagram in an equilibrium state. In the equilibrium state, energy bands of the combined substrate 200, layers 205, 210, 215, and 220, and control gate electrode 225 may be partially bent or inclined due to differences between their work functions. The energy band diagram of FIG. 9B may be simplified for convenience of description.

Referring to FIGS. 8 and 9B, the second charge storage layer 215 including a semiconductor doped with a p-type dopant includes a conduction band bottom edge $212c'$ and a valence band top edge $212v'$. A Fermi level $212f$ of the second charge storage layer 215 including a semiconductor doped with a p-type dopant is adjacent to the valence band top edge $212v'$.

Because the second charge storage layer 215 includes a semiconductor doped with a p-type dopant, electrons in the second charge storage layer 215 may be stored in the lower valence band than the Fermi level $212f$. For example, electrons in the second charge storage layer 215 may be adjacent to the valence band top edge $212v'$. Accordingly, a third potential barrier formed between the first charge storage layer 210 and the second chare storage layer 215 including a p-type doped semiconductor has the height from the valence band top edge 212v' to the conduction band bottom edge of the first charge storage layer 210. Accordingly, the second potential barrier according to the present invention may be larger than the first potential barrier of FIG. 9A. Moreover, a fourth potential barrier formed between the second charge storage layer 215 including a p-type doped semiconductor and the blocking insulation layer 220 may have a height from the valence band top edge 212v' to the conduction band bottom edge of the blocking insulation layer 220. Therefore, the fourth potential barrier according to the present invention may be larger than the second potential barrier that is described with reference to FIG. 9B.

As a result, if charges stored in the first and/or second charge storage layers 210 and 215 have a type different from majority carriers of a doped semiconductor in the second charge storage layer 215, potential barriers for charges in the second charge storage layer 215 can be increased more. Accordingly, a phenomenon that charges stored in the first and/or second charge storage layers 210 and 215 leak through the blocking insulation layer 220 can be reduced more. Therefore, program efficiency of a non-volatile memory device is improved and a non-volatile memory device having excellent reliability can be realized.

Some embodiments of the present invention disclose a non-volatile memory device capable of further reducing a leakage phenomenon of charges stored in each gate pattern. Especially, the non-volatile memory device of the present invention reduces a phenomenon that charges leak though a blocking insulation layer and a tunnel insulation layer.

Figure 10:
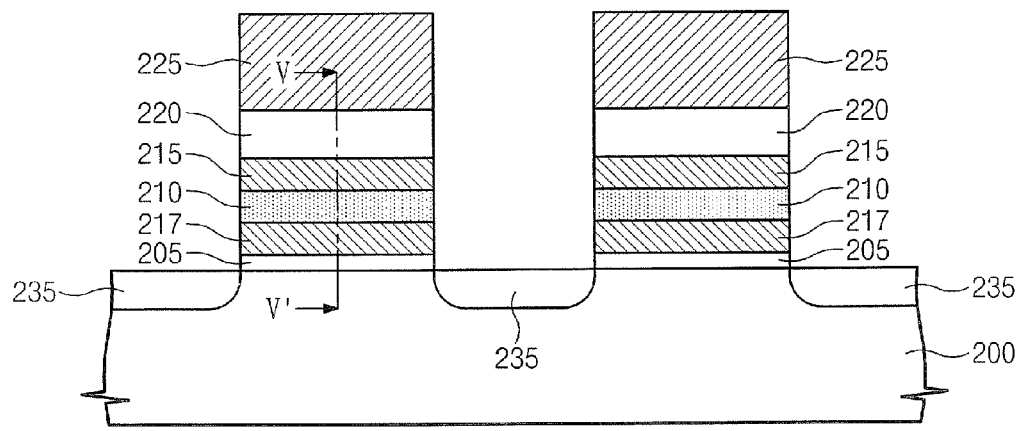
FIG. 10 is a cross-section illustrating non-volatile memory devices according to some embodiments of the present invention.
Figure 11:
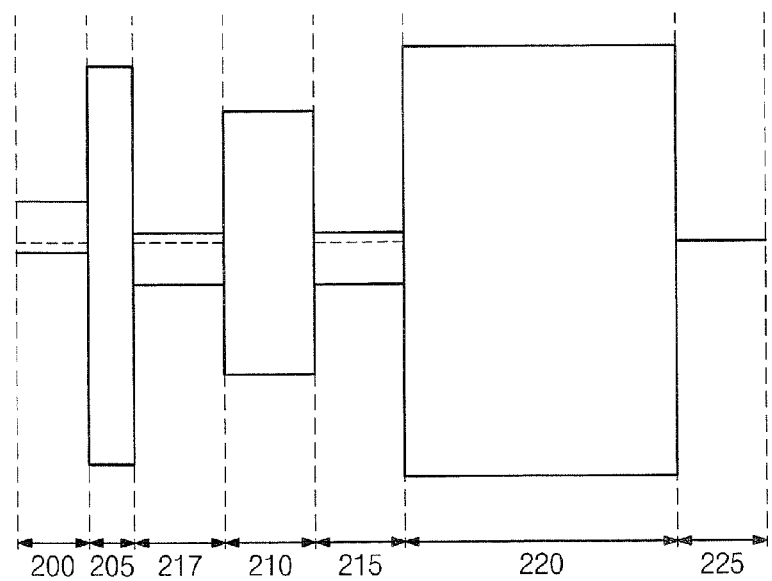
FIG. 11 is an energy band diagram taken along a line V-V' of FIG. 10 in accordance with some embodiments of the present invention.

FIG. 10 is a cross-section illustrating a non-volatile memory device according to some embodiments of the present invention. FIG. 11 is an energy band diagram taken along a line V-V' of FIG. 10.

Referring now to FIGS. 10 and 11, a plurality of gate patterns may be disposed on an active region defined in a substrate 200. A device isolation pattern (not shown) is disposed in the substrate 200 to define the active region. The active region may a portion of the substrate 200 surrounded by the device isolation pattern. The gate patterns are laterally spaced apart from each other.

The gate pattern includes a control gate electrode 225 crossing over the active region and a first charge storage layer 210 interposed between the control gate electrode 225 and the active region. Additionally, each gate pattern may include a tunnel insulation layer 205 interposed between the first charge storage layer 210 and the active region, and a blocking insulation layer 220 interposed between the first charge storage layer 210 and the control gate electrode 225. Furthermore, each of the gate patterns may include a second charge storage layer 215 interposed between the first charge storage layer 210 and the blocking insulation layer 220 and a third charge storage layer 217 interposed between the first charge storage layer 210 and the tunnel insulation layer 205. A source/drain 235 may be disposed on the active regions at the both sides of the control gate electrode 225.

The third charge storage layer 217 may include a conductive charge storing material. The third charge storage layer 217 may have a larger charge storing capacity than the first charge storage layer 210. The third charge storage layer 217 may include a semiconductor doped with a dopant. The present invention is not limited thereto. The third charge storage layer 217 may include another conductive material for storing charges. For example, the third charge storage layer 215 may include the same material as the conductive material in the material layer 130 of FIGS. 1 and 2A.

Charges stored in the first, second and/or third charge storage layers 210, 215, and 217 may have the same type as majority carriers of a doped semiconductor included in the third charge storage layer 217. Unlike this, charges stored in the first, second and/or third charge storage layers 210, 215, and 217 may have a type different from that of majority carriers of a doped semiconductor included in the third charge storage layer 217. The third charge storage layer 217 may include the same material as the second charge storage layer 215. The energy band diagram of FIG. 11 illustrates a case where the second charge storage layer 215 includes a semiconductor doped with an n-type dopant and the third charge storage layer 217 includes a semiconductor doped with an n-type dopant. Since the second and third charge storage layers 215 and 217 include a conductive charge storing material, the second and third charge storage layers 215 and 217 in each gate pattern may be spaced apart from the second and third charge storage layers 215 and 217 in another adjacent gate pattern. In these embodiments, the first charge storage layer 210 in each gate pattern may be spaced apart from the first charge storage layer 210 in another adjacent gate pattern.

According to the non-volatile memory device of the present invention, due to the third charge storage layer 217, a phenomenon that charges stored in the first charge storage layer 210 leak through the tunnel insulation layer 205 can be reduced. That is, when charges stored in the first charge storage layer 210 are excited and transferred toward the tunnel insulation layer 205, they can be stored in the third charge storage layer 217. Moreover, because the third charge storage layer 217 includes a conductive charge storing material, an energy band offset between the third charge storage layer 217 and the tunnel insulation layer 205 is greater than that between the third charge storage layer 217 and the first charge storage layer 210. Accordingly, since a high potential barrier is formed between the third charge storage layer 217 and the tunnel insulation layer 205, a leakage phenomenon of stored charges through the tunnel insulation layer 205 can be reduced. Additionally, as illustrated in some embodiments discussed above, a phenomenon that stored charges leak through the blocking insulation layer 220 due to the second charge storage layer 215 can be reduced. Consequently, a non-volatile memory device having excellent reliability and program efficiency can be realized.

Figure 12:
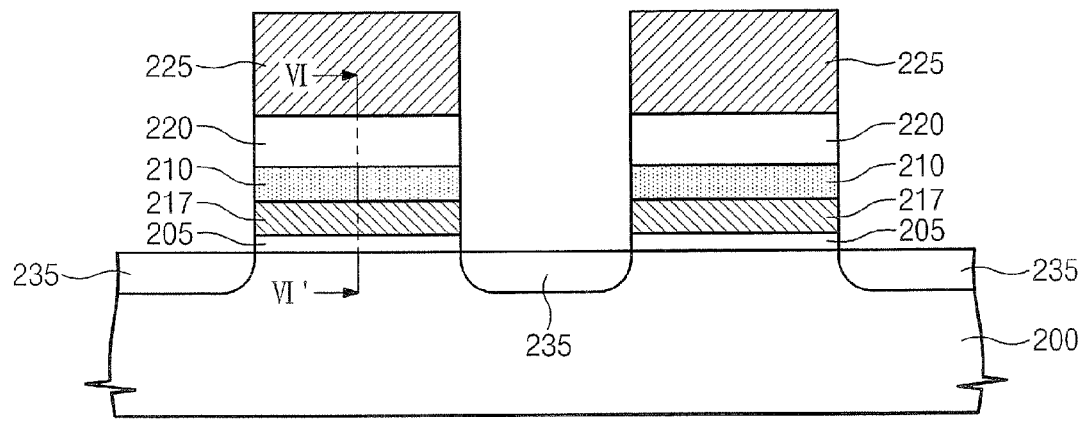
FIG. 12 is a cross-section illustrating non-volatile memory devices according to some embodiments of the present invention.
Figure 13:
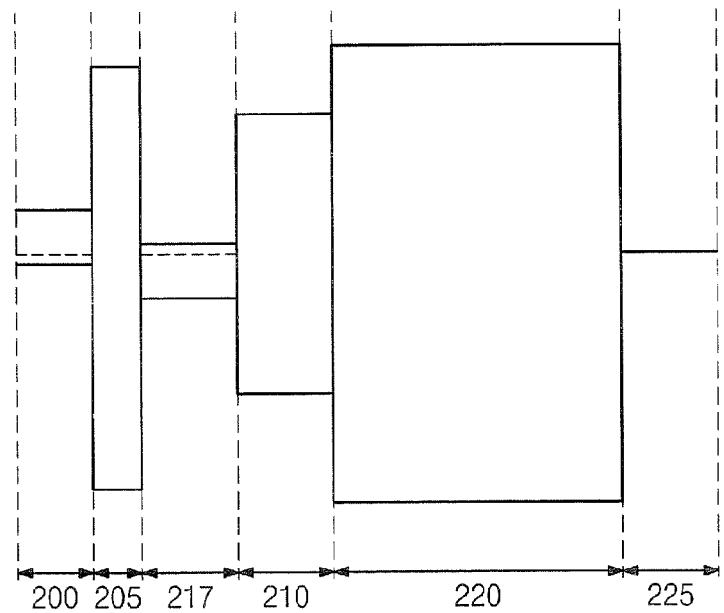
FIG. 13 is an energy band diagram taken along a line VI-VI' of FIG. 12 in accordance with some embodiments of the present invention.

Some embodiments of the present invention disclose a non-volatile memory device in which a leakage phenomenon of charges through a tunnel insulation layer is reduced. FIG. 12 is a cross-section illustrating a non-volatile memory device according to some embodiments of the present invention. FIG. 13 is an energy band diagram taken along a line VI-VI' of FIG. 12.

Referring now to FIGS. 12 and 13, a plurality of gate patterns are laterally disposed on an active region of a substrate 200. Each of the gate patterns includes a control gate electrode 225 crossing over the active region and a first charge storage layer 210 interposed between the control gate electrode 225 and the active region. Additionally, each gate pattern may include a tunnel insulation layer 205 interposed between the first charge storage layer 210 and the active region and a blocking insulation layer 220 interposed between the first charge storage layer 210 and the control gate electrode 225. Furthermore, each gate pattern may include a second charge storage layer 217 interposed between the first charge storage layer 210 and the tunnel insulation layer 205. The second charge storage layer 217 may be formed of the same material as the third charge storage layer 217 illustrated with reference to FIGS. 11 and 12. At this point, the blocking insulation layer 220 may contact the first charge storage layer 210. That is, the non-volatile memory device of some embodiments may be the same as the non-volatile memory device of some embodiments discussed above except that the second charge storage layer 215 is omitted.

The non-volatile memory device according to the present invention reduces a phenomenon that charges stored in each gate pattern leak through the tunnel insulation layer 205 due to the second charge storage layer 217. Therefore, reliability of the non-volatile memory device can be improved and/or its program efficiency can be increased also.

Figure 14:
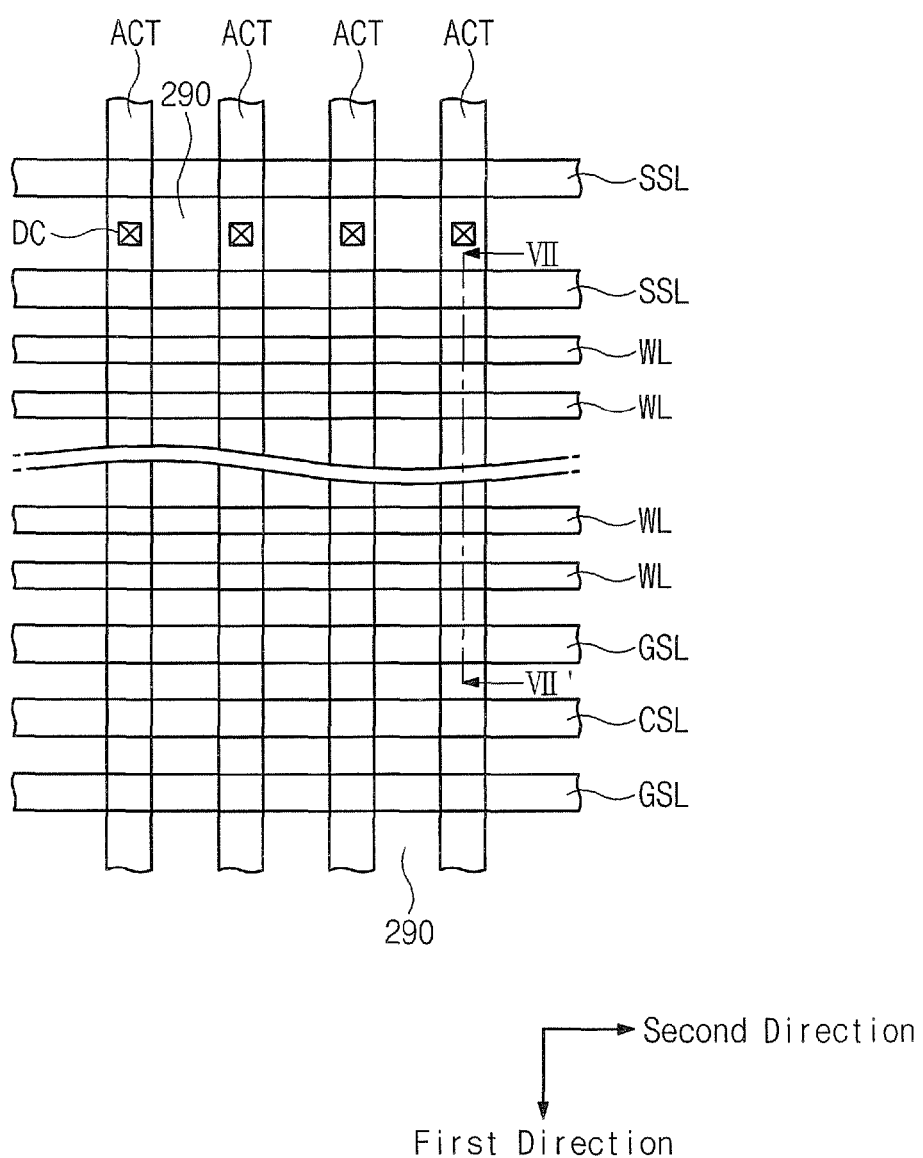
FIG. 14 is a plan view of NAND non-volatile memory devices according to some embodiments of the present invention.
Figure 15:
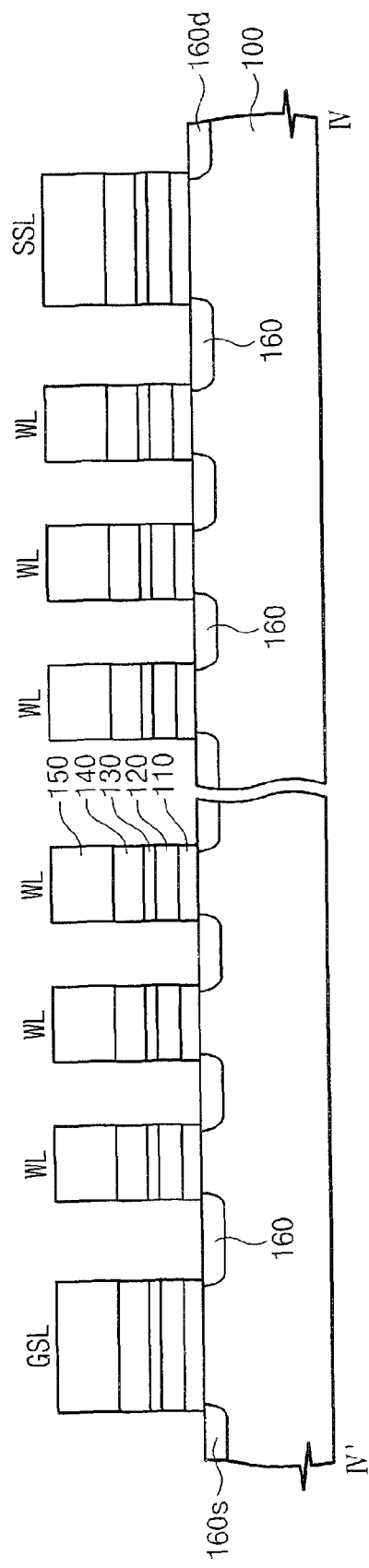
FIG. 15 is a cross-section taken alone a line VII-VII' of FIG. 14 according to some embodiments of the present invention.

Some embodiments of the present invention provide a NAND non-volatile memory device. The NAND non-volatile memory device may include al least one of memory cells discussed above. FIG. 14 is a plan view of a NAND non-volatile memory device according to some embodiments of the present invention. FIG. 15 is a cross-section taken alone a line VII-VII' of FIG. 14.

Referring now to FIGS. 14 and 15, the NAND non-volatile memory device includes a substrate 100 with a cell region. A device isolation pattern 290 is disposed on the substrate 100. The device isolation pattern 290 defines active regions ACT. The device isolation pattern 290 may be a trench-type device isolation pattern. The active regions ACT may be arranged parallel to a first direction. A string selection line SSL and a ground selection line GSL laterally cross over the active regions ACT, and a plurality of word lines WL laterally cross over the active regions ACT between the string selection line SSL and the ground selection line GSL. The string selection line SSL, the ground selection line GSL, and the word lines WL may extend along a second direction perpendicular to the first direction. The string selection line SSL, the word lines WL, and the ground selection line GSL may be included in a cell string group. A plurality of the cell string groups may be repeatedly arranged along the first direction in a mirror symmetry.

A common drain 160d is disposed in the active region ACT at one side of the string selection line SSL, and a common source 160s is disposed in the active region ACT at one side of the ground selection line GSL. Cell source/drain 160 is disposed in the active regions ACT at both sides of each word line WL. The string selection line SSL, a plurality of word lines WL, and the ground selection line GSL are disposed between the common drain 160d and the common source 160s. The common drain 160d, the common source 160s, and the cell source/drains 160 may be regions doped with dopants. Unlike this, at least the cell source/drains 160 may be an inversion layer, which is formed by a fringe field due to an operating voltage applied to the word line WL.

A common source line CSL is disposed on the common sources 160s. The common source line CSL is parallel to the ground selection line GSL, and is connected to the common sources 160s. The word line WL and the cell source/drain 160 constitute a cell transistor. The ground selection line GSL, the common source 160s, and the cell source/drain 160 disposed adjacent to one side of the ground selection line GSL constitute a ground selection transistor. The ground selection transistor and the cell transistor adjacent to the ground selection transistor may share the cell source/drain 160 between the ground selection line GSL and the word line WL that is the most adjacent to the ground selection line GSL. The string selection line SSL, the common drain 160d, and the cell source/drain 160 disposed adjacent to one side of the string selection line SSL constitute a string selection transistor. The string selection transistor shares the cell source/drain 160 between the string selection line SSL and the word line WL that is the most adjacent to the string selection line SSL.

The word line WL may include a control gate electrode 150, a charge storage insulation layer 120, a tunnel insulation layer 110, a blocking insulation layer 140, and a material layer 130. The control gate electrode 150 crosses over the active region ACT, and the charge storage insulation layer 120 is interposed between the control gate electrode 150 and the active region ACT. The tunnel insulation layer 110 is interposed between the charge storage insulation layer 120 and the active region ACT, and the blocking insulation layer 140 is interposed between the control gate electrode 150 and the charge storage insulation layer 120. The material layer 130 may be interposed between the tunnel insulation layer 110 and the blocking insulation layer 140. The material layer 130 may be interposed between the charge storage insulation layer 120 and the blocking insulation layer 140. The material layer 130 may be formed of the same material as embodiments discussed above. Unlike this, the word line WL may include the material layer 130a of FIG. 4 interposed between the tunnel insulation layer 110 and the charge storage insulation layer 120. Unlike this, the word line WL may include the first material layer 130a of FIG. 6 between the tunnel insulation layer 110 and the charge storage insulation layer 120 and the second material layer 130 of FIG. 6 between the charge storage insulation layer 120 and the blocking insulation layer 140 as illustrated in some embodiments. Unlike this, the word line WL may include one of the gate patterns in some embodiments illustrated in FIGS. 8, 9A, 9B, 10, 11, 12 and 13.

A hard mask pattern (not shown) may be disposed on the control gate electrode 150. The ground selection line GSL and the string selection line SSL may have the same vertical structure as the word line WL. However, the line widths of the string selection line SSL and the ground selection line GSL may be different from that of the word line WL. Especially, the line widths of the string selection line SSL and the ground selection line GSL may be greater than that of the word line WL. Layers in the ground and string selection lines GSL and SSL, corresponding to the tunnel insulation layer 110, the charge storage insulation layer 120, the conductive layer 130, and the blocking insulation layer, maybe used as a gate insulation layer of the ground and string selection transistors.

The tunnel insulation layer 110, the charge storage insulation layer 120, the material layer 130, and the blocking insulation layer 140 may extend on an adjacent semiconductor substrate. The word lines WL may share the tunnel insulation layer 110, the charge storage insulation layer 120, the material layer 130, and the blocking insulation layer 140. Additionally, the ground and string selection lines GSL and SSL may share the extended tunnel insulation layer 110, charge storage insulation layer 120, material layer 130, and blocking insulation layer 140. A cell spacer (not shown) may be disposed on the sidewall of the control gate electrode 150. The cell spacer may be disposed on the extended blocking insulation layer 140. A method of operating the NAND non-volatile memory device may be disclosed in U.S. Pat. No. 5,473,563, which is incorporated herein by the reference.

Figure 16:
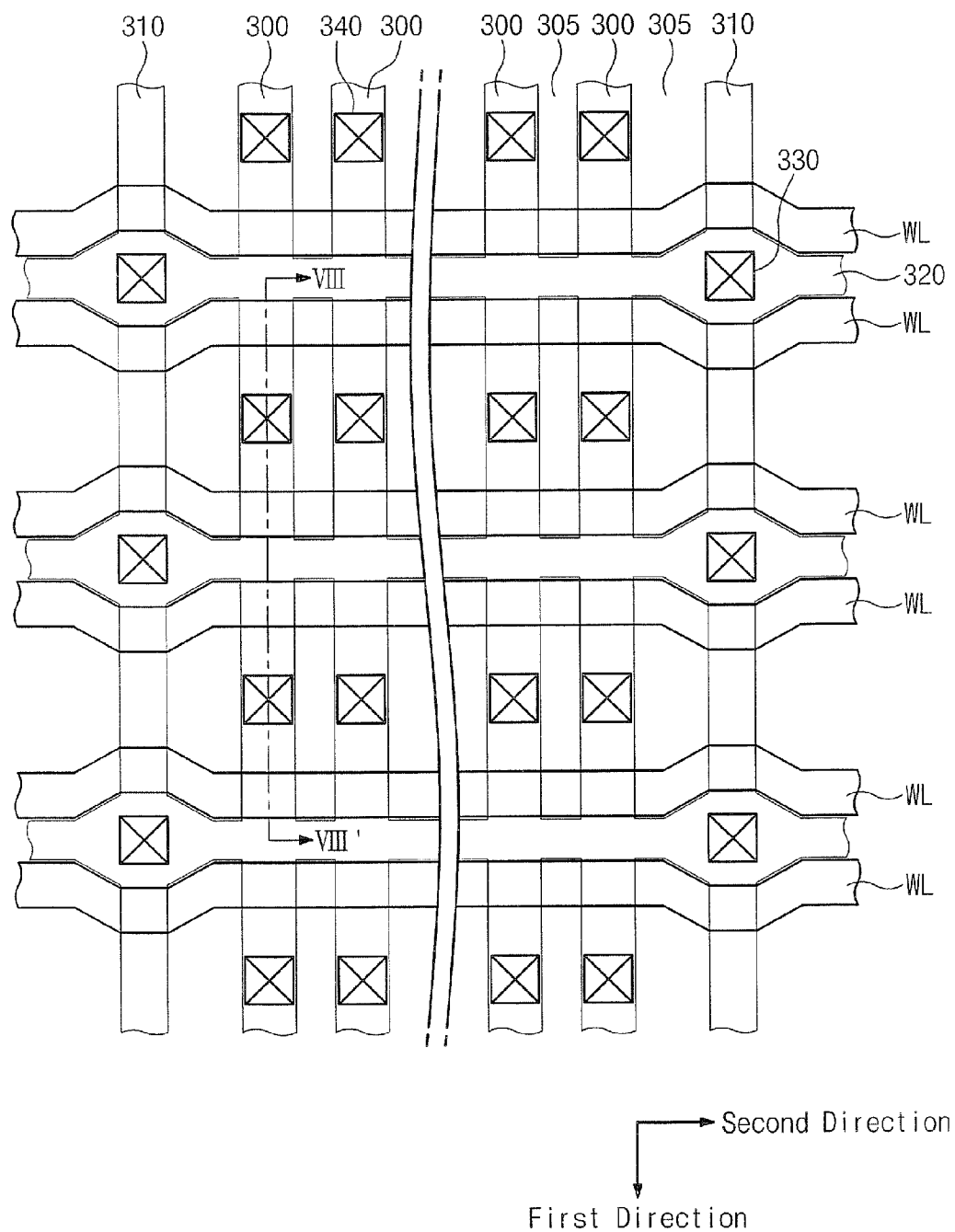
FIG. 16 is a plan view of a NOR non-volatile memory devices according to some embodiments of the present invention.
Figure 17:
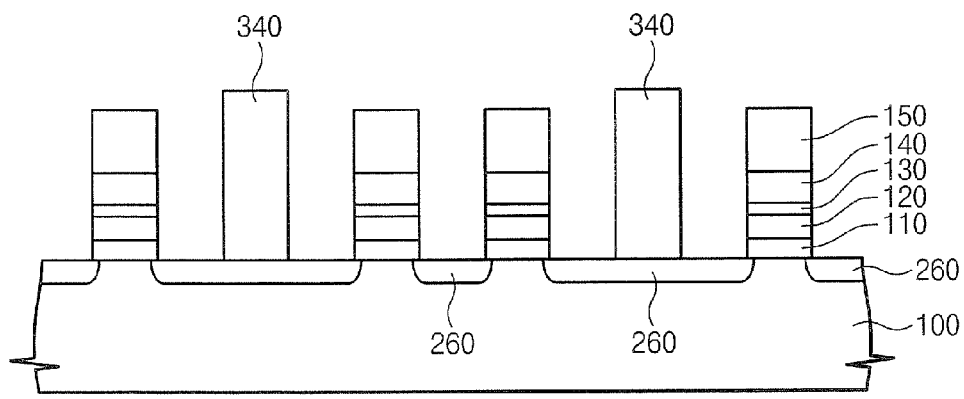
FIG. 17 is a cross-section taken along a line VIII-VIII' of FIG. 16 according to some embodiments of the present invention.

Some embodiments provide a NOR non-volatile memory device. The NOR non-volatile memory device may include at least one of memory cells in some embodiments. FIG. 16 is a plan view of a NOR non-volatile memory device according to some embodiments of the present invention. FIG. 17 is a cross-section taken along a line VIII-VIII' of FIG. 16.

Referring now to FIGS. 16 and 17, the NOR non-volatile memory device may include a substrate 100 with a cell area. A device isolation pattern 305 is disposed on a semiconductor substrate 100 to define active regions 300, 310, and 320. The first active regions 300 may be arranged laterally in a first direction. Source strapping active regions 310 may be regularly disposed between the first active regions 300. The source strapping active regions 310 may extend in the first direction. The second active regions 320 may laterally extend in a second direction perpendicular to the first direction. The second active regions 320 may cross cover the first active regions 300 and the strapping active regions 310 in the second direction. The second active regions 320 may serve as a source line.

A pair of word lines WL may extend in the second direction to cross over on the tops of the first active regions 300 and the source strapping active regions 310. Source/drain 260 may be disposed in the active regions 300, 310, 320 on both sides of each word line WL. The source/drain 260 may be a region doped with a dopant. The source/drain 260 in the first active regions 300 at both sides of the pair of word lines WL may be electrically connected to a bit line through a bit line contact plug 340. The source/drain 260 formed between the pair of word lines WL extend along the second active region 320 to be electrically connected to the source/drains 260 adjacent in the second direction. Accordingly, the second active region 320 may serve as a source line. A source contact 330 may be formed at a position where the second active region 320 and the source strapping active region 310 intersect each other.

As illustrated in some embodiments, the word line WL may include a tunnel insulation layer 110, a charge storage insulation layer 120, a material layer 130, a blocking insulation layer 140, and a control gate electrode 150, which are sequentially stacked on the substrate 100. Unlike this, as illustrated in some embodiments, the word line WL may include the material layer 130a of FIG. 4 interposed between the tunnel insulation layer 110 and the charge storage insulation layer 120. Unlike this, as illustrated in some embodiments, the word line WL may include the first material layer 130a of FIG. 6 interposed between the tunnel insulation layer 110 and the charge storage insulation layer 120 and the second material layer 130 of FIG. 6 interposed between the charge storage insulation layer 120 and the blocking insulation layer 140. Unlike this, the word line WL may include one of gate patterns in some embodiments illustrated in FIGS. 8, 9A, 9B, 10, 11, 12 and 13.

The tunnel insulation layer 110, the charge storage insulation layer 120, the material layer 130, and the blocking insulation layer 140 may extend in the second direction, and the word lines WL may share the tunnel insulation layer 110, the charge storage layer 120, the material layer 130, and the blocking insulation layer 140. A spacer (not shown) may be disposed on the extended blocking insulation layer 150.

On the other hand, the non-volatile memory device disclosed in the above-mentioned embodiments of the present invention may be included in an electron system. The electron system will be described in more detail with reference to FIG. 18.

Figure 18:
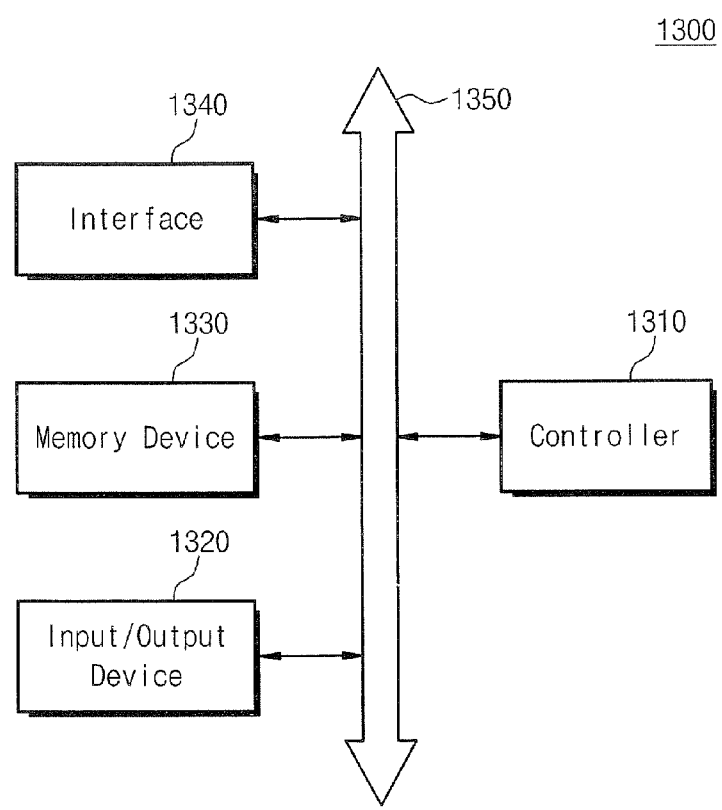
FIG. 18 is a block diagram illustrating an electron system with a non-volatile memory device according to some embodiments of the present invention.
Figure 19:
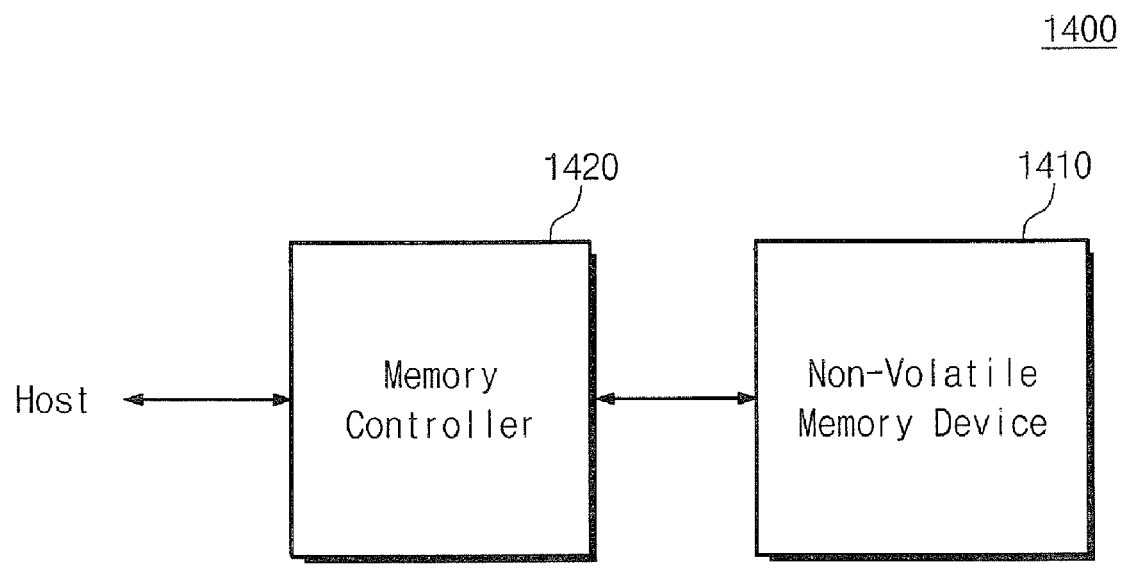
FIG. 19 is a block diagram illustrating a memory card having a non-volatile memory device according to some embodiments of the present invention.

FIG. 18 is a block diagram illustrating an electron system with a non-volatile memory device according to the above-mentioned embodiments of the present invention. Referring to FIG. 12, the electron system 1300 includes a controller 1310, an input/output device 1320, and a memory device 1330. The controller 1310, the input/output device 1320, and the memory device 1330 may be electrically connected to each other through a bus 1350. The bus 1350 corresponds to a path through which data transfer. The controller 1310 may include at least one of a micro processor, a digital signal processor, a micro controller, and like logic devices. The input/output device 1320 may include at least one of a keypad, a keyboard, and a display device. The memory device 1330 stores data. The memory device 1330 may store data and/or commands that will be executed by the controller 1310. The memory device 1330 may include at least one of the non-volatile memory devices of the above-mentioned embodiments. The electron system 1300 may further include an interface 1340 for transmitting data into a communication network or receiving data from the communication network. The interface 1340 may be a wire or wireless type. For example, the interface 1340 may include an antenna or a wire/wireless transceiver.

The electron system 1300 may be realized with a mobile system, a personal computer, an industrial computer, or a system performing various functions. For example, the mobile system may be a personal digital assistant (PDA), a portable computer, a web tablet, a mobile phone, a wireless phone, a laptop computer, a memory card, a digital music system, or an information transmitting/receiving system. If the electron system 1300 is equipment for performing wireless communication, it may be used in a communication interface protocol of the third generation communication system such as Code Division Multiple Access (CDMA), Global System for Mobile communication (GSM), North American Digital Cellular (NADC), Extended-Time Division Multiple Access (E-TDMA), Wide-band Code Division Multiple Access (CDMA), and CDMA200.

A memory card according to the above-mentioned embodiments of the present invention will be described with reference to FIG. 13. FIG. 13 is a block diagram illustrating a memory card having a non-volatile memory device according to some embodiments of the present invention. As illustrated in FIG. 13, the memory card 1400 includes a non-volatile memory device 1410 and a memory controller 1420. The non-volatile memory device 1410 stores data or reads its stored data. The non-volatile memory device 1410 may include at least one of the non-volatile memory devices of some embodiments discussed. The memory controller 1420 controls the non-volatile memory device 1410 to read its stored data or store data therein in response to a read/write request of a host According to the present invention, a material layer with an energy level constituting the bottom surface of a potential well is interposed between a tunnel insulation layer and a blocking insulation layer. Due to the potential well, a phenomenon that charges stored in a charge storage insulation layer leak through the tunnel insulation layer and/or the blocking insulation layer can be reduced. Therefore, a non-volatile memory device having excellent reliability can be realized. In particular, due to the potential well, a phenomenon that charges stored in the charge storage insulation layer leak through the tunnel insulation layer and/or the blocking insulation layer can be reduced in a data storing state. Therefore, a non-volatile memory device having excellent reliability can be realized. Additionally, a phenomenon that charges transferred to the charge storage insulation layer by tunneling through the tunnel insulation layer leak can be reduced. Therefore, program efficiency of a non-volatile memory device can be improved. As a result, damage of a non-volatile memory device can be reduced and also its power consumption can be reduced. Furthermore, a non-volatile memory device having excellent reliability can be optimized for the high degree of integration.

While the present invention has been particularly shown and described with reference to exemplary embodiments thereof, it will be apparent to those skilled in the art that the scope of the invention is given by the appended claims, rather than the preceding description, and all variations and equivalents which fall within the range of the claims are intended to be embraced therein. Therefore, it should be understood that the above embodiments are not limitative, but illustrative in all aspects.

What is claimed is:

1. A non-volatile memory device comprising:
   a control gate electrode on a substrate;

a charge storage insulation layer between the control gate electrode and the substrate;

a tunnel insulation layer between the charge storage insulation layer and the substrate;

a blocking insulation layer between the charge storage insulation layer and the control gate electrode; and a material layer between the tunnel insulation layer and the blocking insulation layer, the material layer having an energy level constituting a bottom of a potential well, wherein the material layer comprises an insulating material; and wherein a bottom edge of a conduction band of the insulating material in the material layer is included in an energy level of the material layer and an electron affinity of the insulating material is greater than that of the charge storage insulation layer.

2. The device of claim 1, wherein the material layer comprises a conductive material.

3. The device of claim 1, wherein the insulating material in the material layer has a higher dielectric constant than the tunnel insulation layer.

4. The device of claim 1, wherein the potential well comprises an inner potential barrier generated by the charge storage insulation layer.

5. The device of claim 2, wherein a Fermi level of the conductive material in the material layer is included in the energy level of the material layer and a work function of the conductive material is greater than an electron affinity of the charge storage insulation layer.

6. The device of claim 4, wherein the potential well further comprises an inner potential barrier generated by the blocking insulation layer.

7. The device of claim 4, wherein the potential well further comprises an inner potential barrier generated by the tunnel insulation layer.

8. A non-volatile memory device comprising:
a control gate electrode on a substrate;
a charge storage insulation layer between the control gate electrode and the substrate;
a tunnel insulation layer between the charge storage insulation layer and the substrate;
a blocking insulation layer between the charge storage insulation layer and the control gate electrode; and
a material layer between the tunnel insulation layer and the blocking insulation layer, the material layer having an energy level constituting a bottom of a potential well,
wherein the material layer comprises an insulating material; and
wherein the insulating material in the material layer comprises a trap and wherein an energy difference between a bottom of the trap in the insulating material and a vacuum level is greater than an energy difference between a bottom of a trap of the charge storage insulation layer and the vacuum level.

9. A non-volatile memory device comprising:
a control gate electrode on a substrate;
a charge storage insulation layer between the control gate electrode and the substrate;
a tunnel insulation layer between the charge storage insulation layer and the substrate;
a blocking insulation layer between the charge storage insulation layer and the control gate electrode; and
a material layer between the tunnel insulation layer and the blocking insulation layer, the material layer having an energy level constituting a bottom of a potential well,
wherein the material layer comprises:
a first layer between the tunnel insulation layer and the charge storage insulation layer and including an energy level constituting a bottom of a first potential well; and
a second layer between the charge storage insulation layer and the blocking insulation layer and including an energy level constituting a bottom of a second potential well.

* * * * *